US006966025B2

(12) United States Patent
Urata et al.

(10) Patent No.: US 6,966,025 B2
(45) Date of Patent: Nov. 15, 2005

(54) D/A CONVERSION APPARATUS, DECODER, AND TAPE DRIVE

(75) Inventors: Kaoru Urata, Kanagawa (JP); Hirokazu Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 425 days.

(21) Appl. No.: 10/251,105

(22) Filed: Sep. 20, 2002

(65) Prior Publication Data

US 2003/0084396 A1 May 1, 2003

(30) Foreign Application Priority Data

Sep. 21, 2001 (JP) ............................ 2001-288775

(51) Int. Cl.[7] ........................ G06F 11/00; H03M 13/00
(52) U.S. Cl. ...................................... 714/811; 714/800
(58) Field of Search ............................... 714/746, 758, 714/799, 800, 802, 811, 712; 341/126, 144, 341/146, 151, 94, 101; 360/53, 31; 369/53.1, 369/53.12, 53.31, 53.32, 53.33, 53.35

(56) References Cited

U.S. PATENT DOCUMENTS

| | | | | |
|---|---|---|---|---|
| 4,433,416 | A * | 2/1984 | Kojima | 714/755 |
| 5,717,705 | A * | 2/1998 | Shikakura et al. | 714/746 |
| 5,805,369 | A * | 9/1998 | Murabayashi | 360/53 |
| 6,189,127 | B1 * | 2/2001 | Fang et al. | 714/799 |

* cited by examiner

*Primary Examiner*—Christine T. Tu
(74) *Attorney, Agent, or Firm*—Frommer Lawrence & Haug LLP; William S. Frommer; Thomas F. Presson

(57) ABSTRACT

A D/A converter has a serial interface. Of the sets of the data representing multiple control signals output from latch circuits, the data representing input data, the data representing strobe signal, and the data representing clock signal are supplied to the D/A converter. A mask circuit is provided in the path supplying the strobe signal. When a parity detection circuit detects a transmission error, the mask circuit masks the strobe signal to be supplied to the D/A converter, thereby preventing the D/A converter from outputting an analog output signal corresponding to the input data.

12 Claims, 15 Drawing Sheets

123

F I G . 1 8
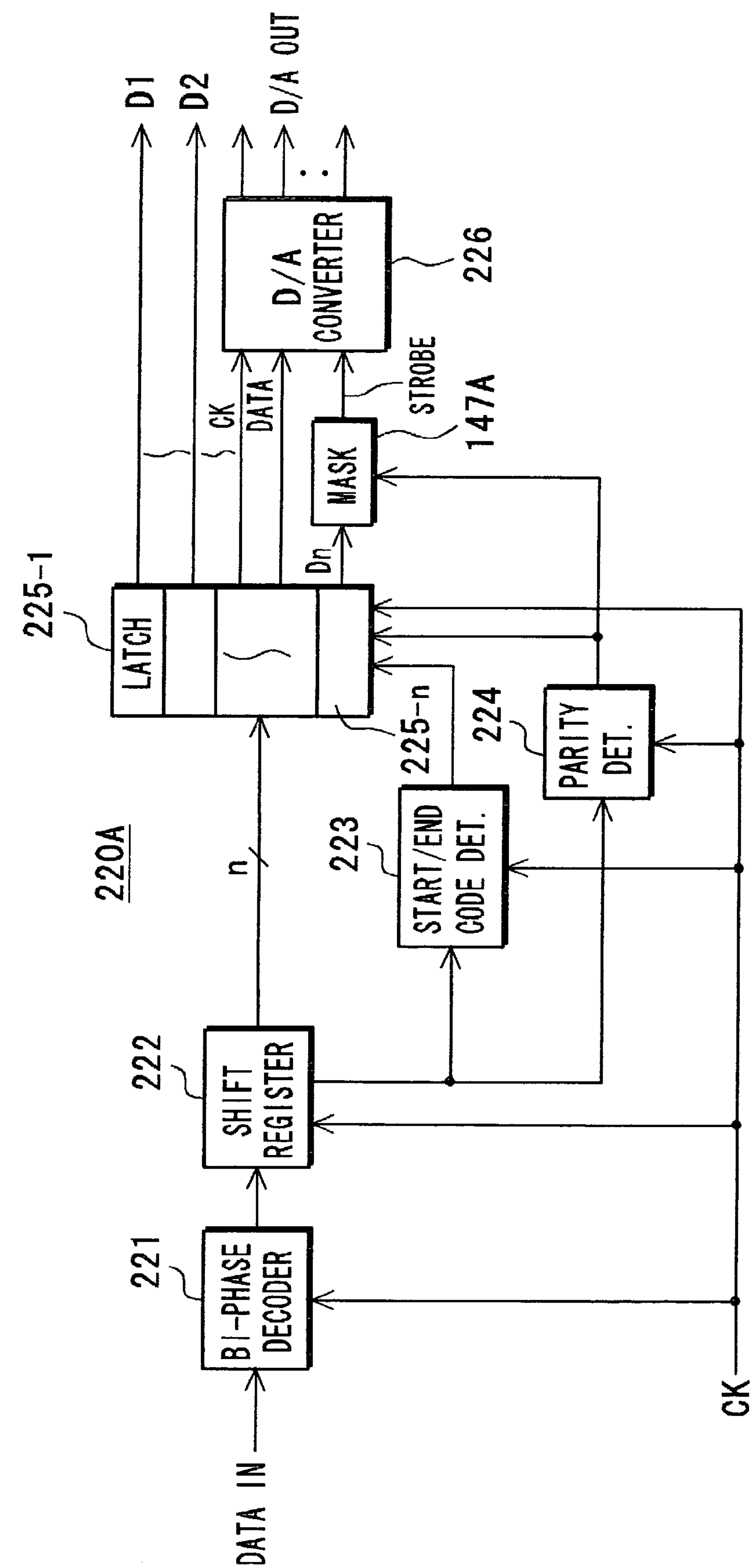

D/A CONVERSION APPARATUS, DECODER, AND TAPE DRIVE

BACKGROUND OF THE INVENTION

1. Field of the Invention

The invention relates to a digital video tape recorder (VTR). More particularly, the invention relates to a digital to analog (D/A) conversion apparatus, a decoder having such D/A conversion apparatus for decoding transmission signals, and a tape drive equipped with such decoder.

2. Description of Related Art

FIG. 1 shows an exemplary tape format for use in a digital video tape recorder (VTR). In track pattern thereof, two video sectors VS and four audio sectors AS are provided on each helical track TR. The four audio sectors AS are disposed between two video sectors VS.

In a conventional VTR, multiple control signals including record enable signals are transferred to devices associated with a rotary drum side via a rotary transformer. The multiple control signals are supplied to the rotary transformer in the form of a serial signal. The devices associated with the rotary drum retrieve the multiple control signals from the serial signal received from the rotary transformer. In order to convert the multiple control signals into the serial signal, use is made of a multiplex (MPX) encoder, and in order to retrieve the multiple control signals from the serial signal, an MPX decoder is used.

In the digital VTR, audio insert requires recording signals in the insert areas provided for audio signal at accurate timing. It is therefore necessary to transfer the control signals such as record enable signal via the MPX encoder and the MPX decoder at accurate timing.

FIG. 2 is an enlarged view of the typical insert area. Provided before and after each insert area are a pre-amble and a post-amble (not shown), respectively. It is noted that if a record enable signal is passed through an MPX encoder and an MPX decoder (hereinafter simply referred to as MPX also), the jitters will result in the record enable signal. The jitters overlap the pre-amble. These jitters depend on the translate cycle of register in the MPX decoder. In order to achieve accurate audio insert, this translate cycle is preferably short.

FIG. 3 shows a serial data format for use with conventional MPX scheme. In the conventional MPX scheme, the data format includes, in addition to 17-bit resister data (DATA), an 8-bit start code (START CODE), 1-bit odd parity (ODD PARITY), 4-bit end code (END CODE), and 8-bit interval (INTERVAL). Each bit of the 17-bit register data is assigned to one control signal.

Thus, in the conventional MPX serial data format, such 21-bit redundancy (start code, odd parity, end code, and interval) should be added to the 17-bit register data, which leads to an encoding rate of 0.5 or less, due to the high redundancy.

Moreover, if the register data has 36 bits, then the redundancy is more than 21-bits for 36-bit register data. Therefore, the conventional MPX serial data format has a drawback in that on account of inevitable increase in redundancy with number of bits the data has, multiple control signals disadvantageously require much too long translate cycle of the register in the MPX decoder, resulting in inefficient data transmission.

FIG. 4 shows a configuration of a conventional MPX encoder 210.

The MPX encoder 210 includes latch circuits 211-1–211-*n* each for latching a set of 1-bit data D1–Dn as the control signals every translate cycle, a start/end code generation circuit 212 for generating a start code and an end code, a parity generation circuit 213 for generating a 1-bit odd parity every n-bit sets of the register data latched and obtained by the latch circuits 211-1–211-*n*, and an interval generation circuit 214 for generating an interval.

The MPX encoder 210 also includes a shift register 215 for generating a data sequence for one translate cycle and transmitting each data sequence as the serial data (SERIAL DATA). The data sequence is generated so that the start and end codes generated by the start/end code generator 212, the odd parity generated by the parity generation circuit 213, and the interval generated by the interval generation circuit 214 are added to each set of the n-bit register data sequentially latched and obtained in the latch circuits 211-1–211-*n*. The MPX encoder 210 further includes a bi-phase encoder 216 for bi-phase encoding the serial data received from the shift register 215 to obtain an output data (DATA OUT).

It is noted that a clock signal CK is supplied to the latch circuits 211-1–211-*n*, the start/end code generator 212, parity generation circuit 213, interval generation circuit 214, shift register 215, and bi-phase encoder 216 to allow them to be operated on the clock signal CK.

Referring to FIG. 4, operations of the MPX encoder 210 will now be discussed.

Each set of 1-bit data D1–Dn as the control signal is supplied to the latch circuit 211-1–211-*n*. The latch circuits 211-1–211-*n* respectively latch the set of the data D1–Dn for each translate cycle. The register data thus latched in the latch circuits 211-1–211-*n* constitute n-bit parallel data. Such parallel data is sequentially supplied to the shift register 215.

The n-bit data latched and obtained for each one translate cycle in the latch circuits 211-1–211-*n* is also supplied to the parity generation circuit 213. In the parity generation circuit 213, a 1-bit odd parity is generated on n-bit register data basis. The odd parity thus generated is supplied to the shift register 215.

In the shift register 215, the start and end codes generated by the start/end code generator 212, the odd parity generated by the parity generation circuit 213, and the interval generated by the interval generation circuit 214 are added to each set of the n-bit register data received from the latch circuit 211-1–211-*n* to form the data sequence for each translate cycle (as shown in FIG. 3).

The shift register 215 serially transmits and supplies each data sequence thus formed to the bi-phase encoder 216 as a serial data. The bi-phase encoder 216 receives and bi-phase encodes the serial data from the shift register 215 to transmit it as serial output data (DATA OUT). The clock signal CK supplied to the respective circuits is also output from the encoder as an output clock signal (CK OUT).

FIG. 5 shows a configuration of a conventional MPX decoder 220. The MPX decoder 220 includes a bi-phase decoder 221 for performing bi-phase decoding on the serial input data (DATA IN) fed thereto to obtain a data sequence for each translate cycle sequentially, and a shift register 222 for shifting each data sequence obtained in the bi-phase decoder 221. The shift register 222 is constituted of a multiplicity of serially connected registers that are respectively associated with, for example, start code (START CODE), register data (DATA), odd parity (ODD PARITY), and end code (END CODE) in the data sequence for each translate cycle.

The MPX decoder 220 also includes a start/end code detection circuit 223 for detecting the start and end codes in the outputs from the registers of the shift register 222, each register corresponding to the start and end codes, and a parity detection circuit 224 for detecting a transmission error in the output from the registers of shift register 222, each register corresponding to the register data and the odd parity.

The MPX decoder 220 also includes latch circuits 225-1–225-*n* each for latching the outputs of n registers in the shift register 222, each register corresponding to the register data thereof, to obtain a set of data D1–Dn as the control signal, provided that the relevant start and end codes are detected in the start/end code detection circuit 223 and that no transmission error is detected by the parity detection circuit 224.

The MPX decoder 220 further has a D/A converter 226 having a serial interface. Of the sets of data D1–Dn as the control signals transmitted from the latch circuits 225-1–225-*n*, the data representing the clock signal CK, the data representing strobe signal STROBE, and the data representing input data DATA are supplied to the D/A converter 226. From the D/A converter 226, a multiplicity of analog output signals (D/A OUT) is obtained for controlling, for example, gains of record amplifiers in multiple channels.

The clock signal CK is also supplied to the bi-phase decoder 221, the shift register 222, the start/end code detection circuits 223, the parity detection circuit 224, and the latch circuits 225-1–225-*n* to allow them to be operated on the clock signal CK. Simply stated, this clock signal CK is the output (CK OUT) of the above MPX encoder 210, supplied therefrom via the rotary transformer.

Referring to FIG. 5, operations of the MPX decoder 220 will be explained below.

Serial input data (DATA IN) is supplied to the bi-phase decoder 221. The input data (DATA IN) is the output data (DATA OUT) issued from the MPX encoder 210 mentioned above via the rotary transformer. The bi-phase decoder 221 bi-phase decodes the input data (DATA IN) to obtain the data sequence for each translate cycle sequentially. Each of the data sequences obtained in the bi-phase decoder 221 is sequentially supplied to, and registered in, the shift register 222.

The start/end code detection circuit 223 receives the outputs of the multiple registers in the shift register 222, each register corresponding to the respective bits of the start and end codes, for detection of the start and end codes. The output of the start/end code detection circuit 223 (referred to as detection signal) is also supplied to the latch circuits 225-1–225-*n*. The parity detection circuit 224 receives the outputs from multiple registers in the shift register 222, each register corresponding to respective bits of the register data and the odd parity, for detection of a transmission error. The output (detection signal) of the parity detection circuit 224 is supplied to the latch circuits 225-1–225-*n*.

The latch circuits 225-1–225-*n* receives outputs from the n registers in the shift register 222 each register corresponding to respective bits of register data. In the latch circuits 225-1–225-*n*, the outputs of n registers in the shift register 222, each register corresponding to respective bits of register data, are latched to obtain a set of data D1–Dn as the control signals, provided that the relevant start and end codes are detected in the start/end code detection circuit 223 and no transmission error is detected in the parity detection circuit 224.

It is noted that the latch circuits 225-1–225-*n* refrains from latching the outputs from the n registers of the shift register 222, each register corresponding to respective bits of register data, when the parity detection circuit 224 detects a transmission error, if the start/end code detection circuit 223 detects the start and end codes. Instead, the latched output by the latch circuits 225-1–225-*n* in the preceding cycle is held in the latch circuit as it is. In that event, therefore, no register data accompanying a transmission error may be latched in the latch circuits 225-1–225-*n*, thereby preventing the erroneous set of data D1–Dn from being output as control signals.

Of the sets of data D1–Dn as the control signals available from the latch circuits 225-1–225-*n*, the data representing the clock signal CK, the data representing strobe signal STROBE, and the data representing input data DATA are supplied to the D/A converter 226. The D/A converter 226 receives the input data DATA and the set of data is sequentially entered in the shift registers therein in synchronism with the clock signal CK.

As will be stated later, such input data DATA is composed of an address data indicative of the channel which the data DATA is associated with and subsequent gain control data for controlling the gain of the record amplifier in the channel specified by the address data as a separate data sequence. At the timing of supplying the strobe signal STROBE (this timing hereinafter referred to as STROBE supply timing), analog output signal (D/A OUT) for controlling the gain of the record amplifier in the channel thus specified by the address data as a prescribed separate data sequence is updated to a value that corresponds to the gain control data contained in the corresponding data sequence.

FIG. 6 shows a configuration of the D/A converter 226. The D/A converter 226 has a shift register 231 for sequentially receiving the input data DATA in synchronism with the clock signal CK. The shift register 231 comprises a multiplicity of serially connected registers each corresponding to portions related to the address data and the gain control data contained in the separate data sequence in the above input data DATA.

The D/A converter 226 also has an address decoder 232 for decoding, at the STROBE supply timing, the outputs of the multiple registers associated with the respective bits of the address data in the shift register 231 and for supplying a latch pulse to selected one of the multi-channel latch circuits 233-1–233-L as described later.

At the STROBE supply timing, the outputs of the registers in the shift register 231, each register corresponding to the respective bits of the address data, constitute the address data within the separate data sequence in the input data DATA. Concurrently, the outputs of the registers in the shift register 231, each register corresponding to the respective bits of the gain control data, constitute the gain control data within the separate data sequence in the input data DATA The D/A converter 226 also has latch circuits 233-1–233-L, associated with first through $L^{th}$ channels, respectively, each for latching the outputs of the multiple registers in the shift register 231 as a whole, each registers corresponding to the respective bits of the gain control data. Each of the latch circuits 233-1–233-L receives a latch pulse issued from the address decoder 232, as already stated.

The D/A converter 226 further has D/A conversion sections 234-1–234-L each for converting into respective analog signals the gain control data for the first through $L^{th}$ channels latched in the latch circuits 233-1–233-L, and buffers 235-1–235-L each for receiving the analog output signals (D/A OUTPUT) from the D/A conversion sections 234-1–234-L and supplying them to the record amplifiers (not shown) associated with the first through $L^{th}$ channels.

Referring again to FIG. 6, operations of the D/A converter 226 will be described below.

Input data DATA and the clock signal CK are supplied to the shift register 231, where the input data DATA is sequentially registered in synchronism with the clock signal CK.

The outputs of the registers in the shift register 231, each register corresponding to the respective bits of the address data, are supplied to the address decoder 232, while the outputs of the registers in the shift register 231, each register corresponding to the respective bits of the gain control data, are supplied as a whole to the latch circuits 233-1–233-L.

In the address decoder 232, the outputs of the registers in the shift register 231, each register corresponding to the respective bits of the address data of shift register 231, are decoded at the STROBE supply timing. A latch pulse is supplied from the address decoder 232 to a latch circuit at the particular channel specified by the address data, among the latch circuits 233-1–233-L. In the latch circuits that are provided with the latch pulse, the outputs of the registers in the shift register 231, each register corresponding to the respective bits of the gain control data, are latched as a whole.

The gain control data thus latched in the latch circuit for that particular channel is supplied to the D/A conversion section associated with that particular channel among D/A conversion sections 234-1–234-L and converted to an analog signal before it is supplied to the record amplifier of that channel via an associated buffer. In this manner, a gain control data is latched at every STROBE supply timing in the latch circuit associated with that channel specified by the address data, thereby updating the analog output signal D/A OUT for that channel.

FIG. 7 shows a timing diagram illustrating operations of the D/A converter 226. Part "A" of FIG. 7 is indicated in "FIG. 7-(A)", such representation is used in the following FIGS. 8, 15, 16, and 17. FIG. 7-(A) indicates input data DATA into the D/A converter 226. The input data DATA of separate data sequence consists of 8-bit address data A7–A0 and 8-bit gain control data D7–D0. Such data sequences are sequentially entered into the shift register 231 in synchronism with the clock signal CK as shown in FIG. 7-(B). The gain control data D7–D0 is latched in the latch circuit for the particular channel specified by the address data A7–A0, at time t0 of the STROBE supply timing, as shown in FIG. 7-(C). The analog output signal D/A OUT for that particular channel is then updated as shown in FIG. 7-(D).

If, however, an error is involved in any of the address data A7–A0 and gain control data D7–D0 forming the input data DATA of the separate data sequence, analog output data D/A OUT of a channel other than the particular channel to be updated may be updated and/or a wrong output level could be set as the analog output signal D/A OUT for that particular channel.

FIG. 8 shows a timing diagram illustrating the operations of the D/A converter 226 in a case when an error exists in the gain control data D7–D0. As shown in FIG. 8-(A), when there is an error in the gain control data D7–D0, the incorrect gain control data is entered into the shift register 231 in synchronism with the clock signal CK shown in FIG. 8-(B). Consequently, erroneous gain control data D7–D0 is latched in the latch circuit of the particular channel specified by address data A7–A0 at time t0 of the STROBE supply timing shown in FIG. 8-(C). As a result, the analog output signal D/A OUT of that channel is updated to a wrong level, as shown in FIG. 8-(D).

Thus, the D/A converter 226 of the conventional MPX decoder 220 has a drawback in that, if an error occurs in any of the address data A7–A0 and the gain control data D7–D0 forming an input data DATA of separate data sequence, analog output data D/A OUT of a channel other than the particular channel to be updated may be updated and/or a wrong output level could be set as the analog output signal D/A OUT for that particular channel.

It is, therefore, an object of the present invention to provide D/A conversion apparatus, a decoder having such D/A conversion apparatus for decoding transmission signals, and a tape drive equipped with such decoder wherein even when erroneous input data is supplied to the D/A converter having a serial interface, they prevent an erroneous analog output signal from being output therefrom.

SUMMARY OF THE INVENTION

A D/A conversion apparatus in accordance with one aspect of the invention comprises a D/A conversion section having a serial interface, and error detection means for detecting an error in input data supplied to the D/A conversion section. The D/A conversion apparatus also comprises mask means for masking a strobe signal to be supplied to the D/A conversion section to prevent the D/A conversion section from outputting an analog output signal corresponding to the input data when the error detection means detects the error in the input data.

In accordance with another aspect of the invention, there is provided a decoder for decoding a transmission signal formed by converting multiple control signals to serial signal, to obtain the multiple control signals. The decoder comprises register data extraction means for sequentially extracting multiple sets of register data contained in a prescribed unitary data sequence constituting the transmission signal to output the multiple control signals, and a D/A conversion section having a serial interface. The D/A conversion section receives at least one of the control signals from the register data extraction means as input data and as a strobe signal. The decoder also comprises error detection means for detecting an error in said input data supplied to said D/A conversion section, and mask means for masking a strobe signal to be supplied to said D/A conversion section to prevent the D/A conversion section from outputting an analog output signal corresponding to the input data when the error detection means detects the error in said input data.

In accordance with a still another aspect of the invention, there is provided a tape drive equipped with a decoder. The decoder transmits a transmission signal formed by converting multiple control signals to serial signal to a rotary drum side of the tape drive via a rotary transformer, and obtains the multiple control signals from the transmission signal transmitted to the rotary drum side of the tape drive. The decoder comprises register data extraction means for sequentially extracting multiple sets of register data contained in a prescribed unitary data sequence constituting the transmission signal to output the multiple control signals, and a D/A conversion section having a serial interface. The D/A conversion section receives at least one of the control signals from the register data extraction means as input data and as a strobe signal. The decoder also comprises error detection means for detecting an error in the input data supplied to the D/A conversion section, and mask means for masking a strobe signal to be supplied to said D/A conversion section to prevent the D/A conversion section from outputting an analog output signal corresponding to the input data when the error detection means detects the error in the input data.

In the invention, the D/A conversion section having a serial interface receives input data and a strobe signal. An error in the input data is detected, if any.

As an example, when the input data is composed of bit data extracted in sequence from a prescribed unitary data sequence constituting the serial transmission signal obtained by converting the transmission signal to the serial signal, an error in the input data can be detected using the parity contained in the prescribed unitary data sequence. As another example, when the input data is obtained by decoding a bi-phase encoded signal, an error in the input data can be detected using bi-phase encoding rule.

In the invention, when an error is detected in the input data, the strobe signal to be supplied to the D/A conversion section is masked so as to prohibit the D/A conversion section from outputting its analog output data.

Thus, in accordance with the invention, masking the strobe signal supplied to the D/A conversion section prohibits the D/A conversion section having an serial interface from outputting the analog output signal corresponding to the input data when an error is detected in the data supplied to the D/A conversion section, thereby preventing the D/A conversion section from outputting erroneous analog output signal.

These and other objects and many of the attendant advantages of this invention will be readily appreciated as the same becomes better understood by reference to the following detailed description when considered in connection with the accompany drawings.

BRIEF DESCRIPTION OF DRAWINGS

FIG. 18 is a block diagram representation of an MPX decoder as another embodiment of the invention.

DETAILED DESCRIPTION OF PREFERRED EMBODIMENTS

The following will describe embodiments of this invention with reference to the drawings.

Figure 9:
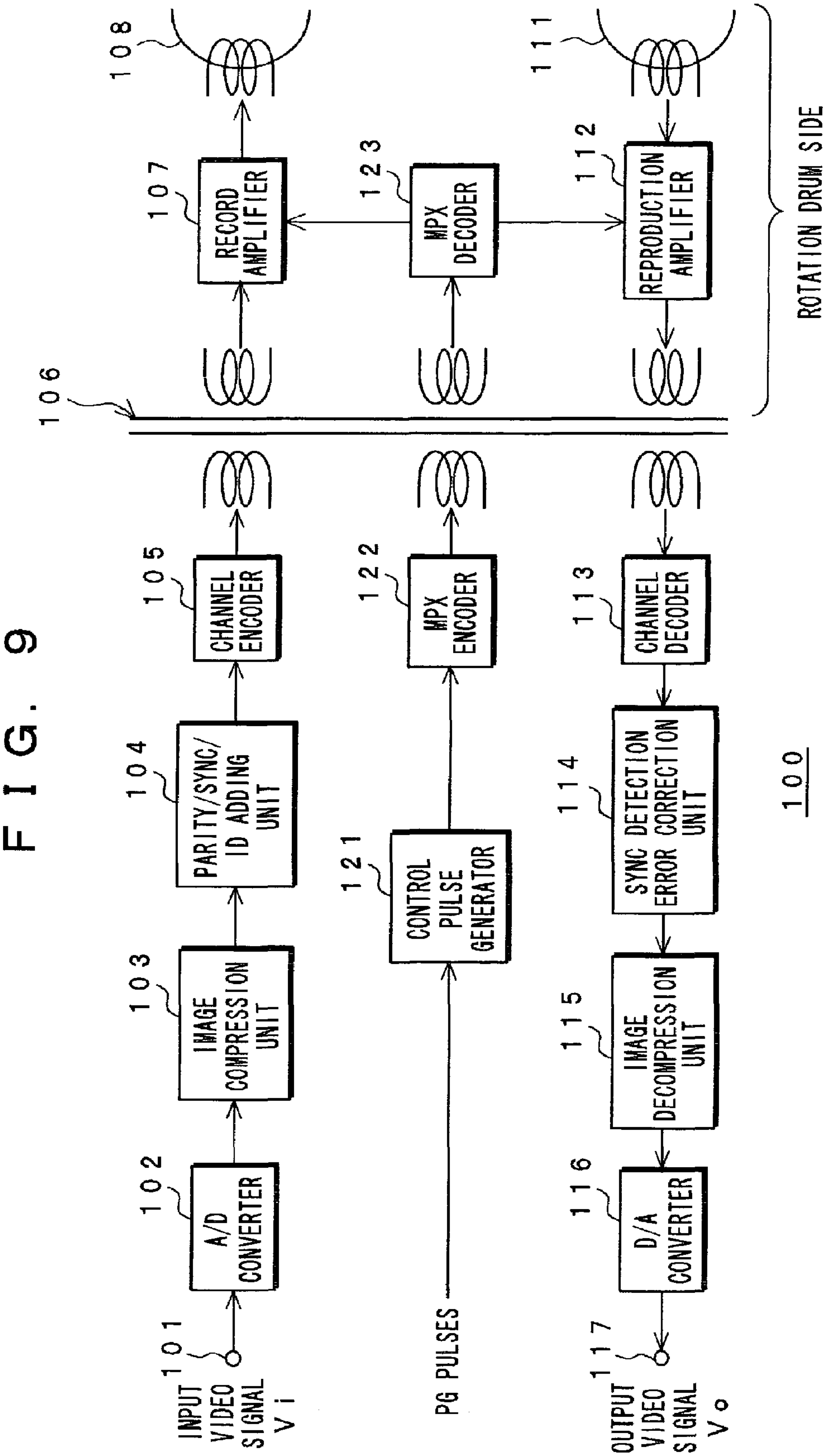
FIG. 9 is a block diagram representation of a basic configuration of a digital VTR as an embodiment of invention.

FIG. 9 shows an embodiment of a digital VTR 100 in its basic configuration according to the invention. For simplicity, description regarding an audio system will be omitted.

First, a recording system of the VTR will be described. An A/D converter 102 receives an input video signal Vi through input terminal 101, converts it to a digital signal, and transmits the digital signal thus converted to an image compression unit 103. The image compression unit 103 compresses the signal using, for example, a block coding technique. A parity/sync/ID adding unit 104 receives the compressed coded data from the image compression unit 103. The adding unit 104 adds error correction parity, a sync indicative of the beginning of a synchronous block, and an ID code for identification of respective synchronous block (referred to as synchronous block ID) to each synchronous block of the compressed coded data.

A channel encoder 105 receives the compressed coded data of each synchronous block from the adding section 104. The channel encoder 105 encodes the compressed data into a predetermined digital format. The channel encoder 105 transmits the digitally encoded signal to a record amplifier 107 associated with a rotary drum for amplification via a rotary transformer 106. After amplified, the signal is supplied to a recording head 108 and sequentially recorded on recording track of a magnetic tape (not shown).

Next, a reproduction system of the VTR will be described. A reproduction head 111 reads reproduction signal from the recording track of the magnetic tape (not shown). A reproduction amplifier 112 then receives and amplifies the signal thus read. A channel decoder 113 receives the amplified signal from the reproduction amplifier 112 via the rotary transformer 106 and decodes it. A sync detection and error correction unit 114 receives compressed coded data of the respective synchronous blocks from the channel decoder 113. The sync detection and error correction unit 114 performs error correction on the compressed coded data using parity contained in each synchronous block.

An image decompression unit 115 then receives the compressed coded data of each synchronous block from the error correction unit 114. The image decompression unit 115 performs a data decompression processing opposite to the processing done in the image compression unit 103 of the recording system. A D/A converter 116 receives the digital data thus decompressed from the image decompression unit 115 and converts it into analog signal, which is output as output video signal Vo through an output terminal 117.

In this digital VTR 100, alternative transmission signals obtained by serially converting multiple control signals for controlling the ON/OFF actions of, for example, the record amplifier 107 and the reproduction amplifier 112 which are associated with the rotary drum, and the gain of the record amplifier 107, are transmitted to devices of the rotary drum side via the rotary transformer 106. Although it is shown in FIG. 9 that each of the recording head 108 and the reproduction head 111 has only one channel, in actuality they have a multiplicity of channels.

In the digital VTR 100, the above control signals are generated by a control pulse generator 121. The control pulse generator 121 generates the control signals based on the pulses (referred to as PG PULSES) generated by a pulse generator (PG) in response to the rotation of the rotary drum. An MPX encoder 122 then receives and encodes the control signals from the control pulse generator 121 and converts it to a serial signal to form the transmission signal. The transmission signal is transmitted to the devices associated with the rotary drum via the rotary transformer 106.

A MPX decoder 123 that provided on the drum substrate then receives and decodes the transmission signal to obtain the control signals. The control signals are supplied to the record amplifier 107, the reproduction amplifier 112 and the like to control ON/OFF operations thereof, the gain of the record amplifier 107, and the like.

Figure 10:
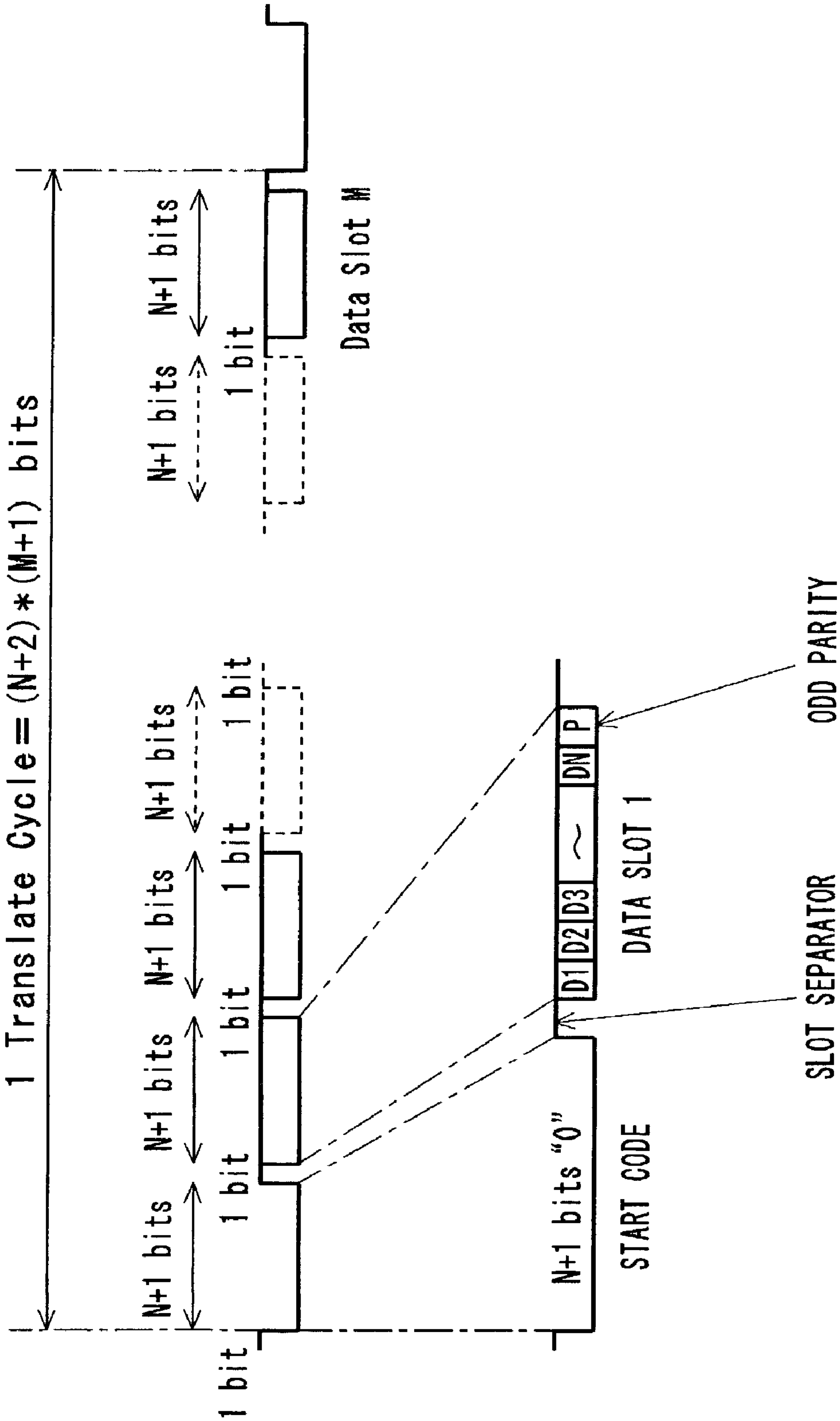
FIG. 10 is a diagram showing a serial data format for use with MPX scheme as an embodiment;.

FIG. 10 shows a serial data format for use with MPX scheme as this embodiment, that is, a serial data format of the transmission data generated by the MPX encoder 122. According to this serial data format for use with MPX scheme, one data slot includes N sets of register data D1–DN each assigned to separate control signal, and the odd parity P. The multiple control signals are transmitted in the form of data sequence for one translate cycle that includes M data slots (M being an positive integer) plus (N+1)-bit start code (N being a positive integer) placed ahead of the M data slots.

Here, the start code is given by (N+1) consecutive bits of logical value "0". One data slot consists of N sets of the register data and the odd parity, as described above, so that any data slot will not be consecutive (N+1) bits of logical value "0". Thus, the MPX decoder 123 can detect the start code without failure. To secure the separation of the start code and each of the data slots, a 1-bit slot separator of logical value "1" is inserted after the start code and after every data slot, the start code and data slot constituting the data sequence for one translate cycle.

Consequently, the data sequence for one translate cycle comprises (N+2)*(M+1) bits, which allows transmission of at most N*M control signals. In operation, the above MPX encoder 122 bi-phase encodes and provides a transmission signal that comprises consecutive data sequences for one translate cycle.

Translate timing of respective control signals in the MPX decoder 123 will now be described for a case where the data has the serial data format as shown in FIG. 10.

Figure 11:
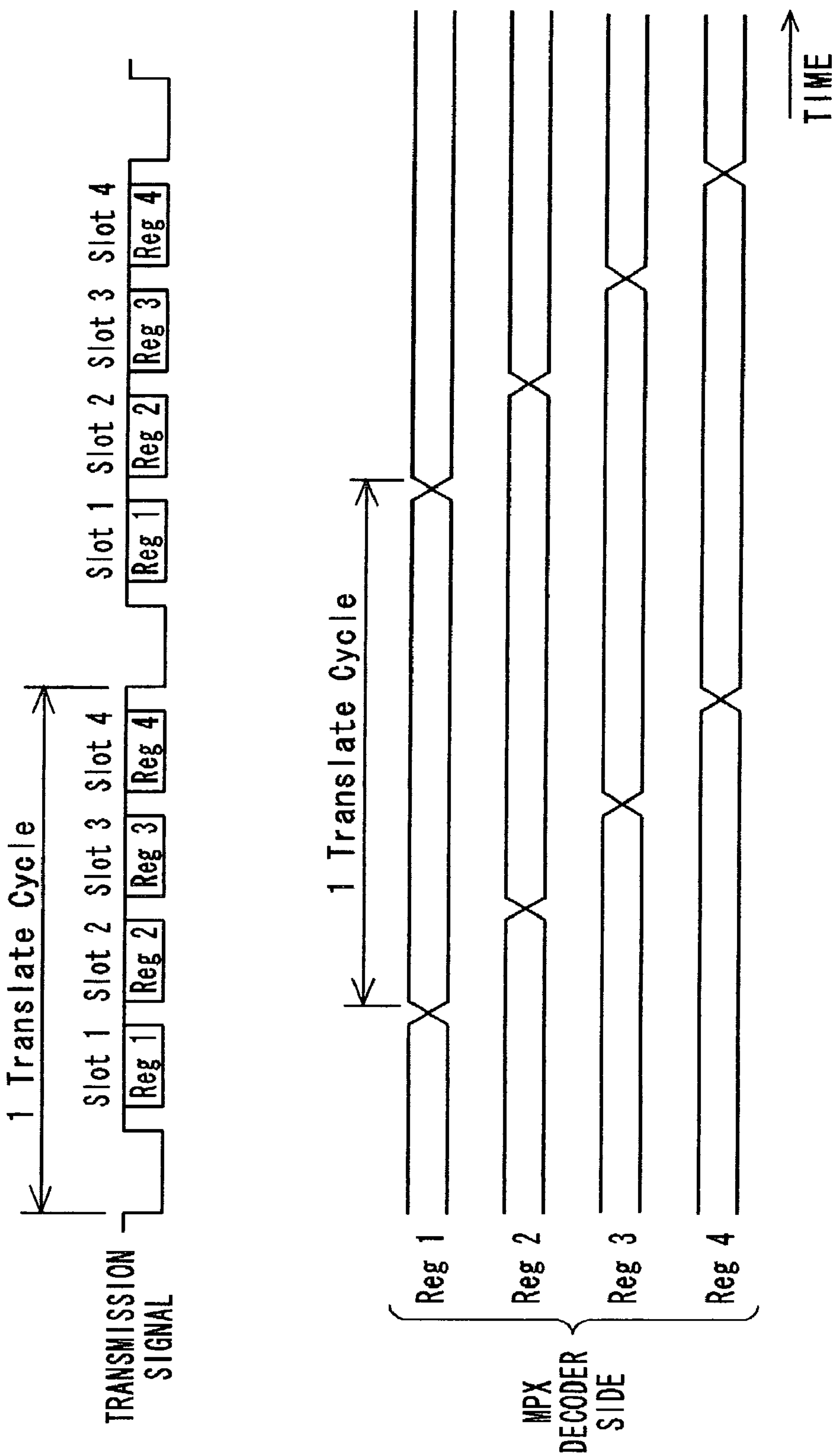
FIG. 11 is a diagram illustrating update timing of respective control signals.

FIG. 11 shows an exemplary format of a transmission signal having four data slots 1–4, each slot including one of the sets of register data Reg1–Reg4. Each of the sets of register data is associated with first through fourth control signals, respectively. In this case, the MPX decoder 123 updates the sets of register data Reg1–Reg4, namely, first through fourth control signals in each translate cycle.

Figure 12:
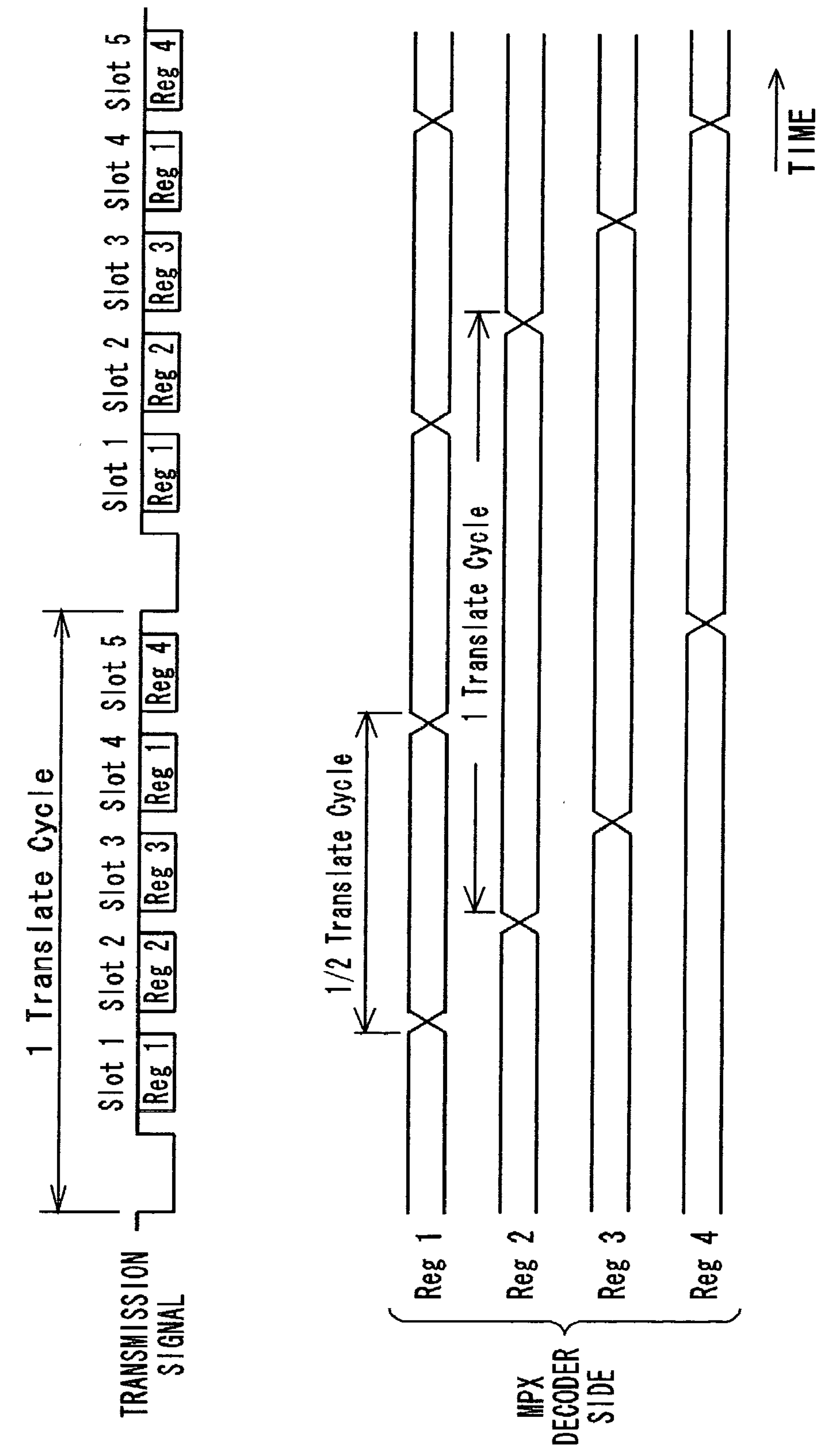
FIG. 12 is a diagram illustrating update timing of respective control signals (with a shortened translate cycle)

FIG. 12 shows an exemplary format of a transmission signal composed of 5 data slots such that slots 1 and 4 contain register data Reg1 associated with the first control signal, and slots 2, 3, and 5 contain register data Reg2, Reg3, and Reg4 associated with the second, third, and fourth control signals, respectively. In this case, the MPX decoder 123 updates the register data Reg1, namely, the first control signal every ½ translate cycle, while it updates the register data Reg2, Reg3, and Reg4, namely the second, third, and fourth control signals every translate cycle. Placing a given register data associated with a certain control signal in multiple slots allows the MPX decoder 123 to update register data or control signal in each translate cycle less than one translate cycle. Thus, it is possible to make faster the translate cycle of a control signal that require a higher precision such as record enable signal and flying erase signal, which are related to the insert record of an audio signal in digital VTR.

Figure 13:
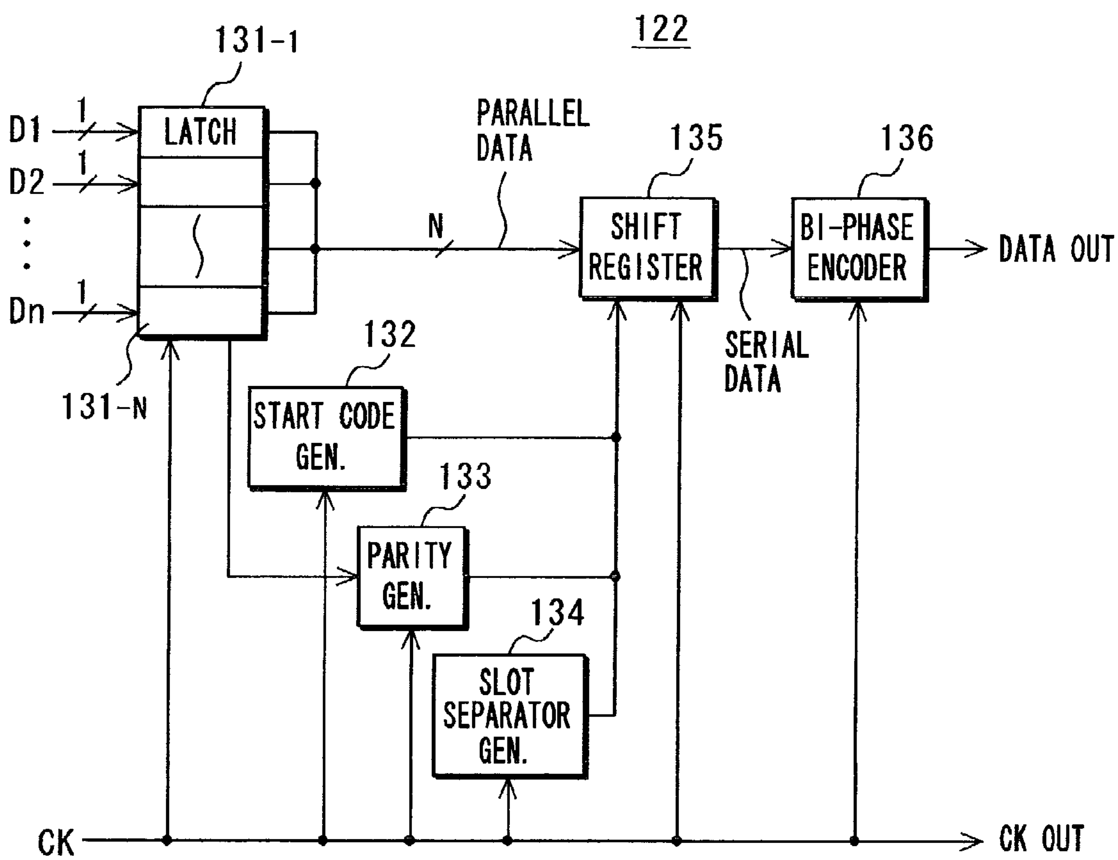
FIG. 13 is a block diagram representation of an MPX encoder as an embodiment of the invention.

FIG. 13 shows a configuration of the MPX encoder 122. This MPX encoder 122 comprises N latch circuits 131-1–131-N for sequentially latching N sets of register data. They are made by dividing "n" sets of 1-bit data D1–Dn indicative of multiple control signals into M data groups, each group consisting of N sets of register data (M and N being positive integers). In this case, the latch circuits 131-1–131-N latch each data group in 1/(M+1) cycle (hereinafter referred to as one data slot cycle) of one translate cycle. They then repeat this latching M times, and poses for one data slot cycle. Similarly, they repeat such latching that the respective data groups are successively latched M times.

In this case, if the number n of the sets of data D1–Dn is less than N×M, dummy data is latched on the vacant portion of data groups which is deficient of register data. Alternatively, the same data associated with one control signal may be assigned to two or more data groups among the M data groups. This also permits the translate cycle of a relevant control signal to be reduced to less than one translate cycle.

The MPX encoder 122 also comprises a start code generation circuit 132 for generating a start code in the form of consecutive (N+1) bits of logical value "0", a parity generation circuit 133 for generating 1-bit odd parity for each data group of N-bit register data obtained by sequentially latching them in the latch circuits 131-1–131-N, and a slot separator generation circuit 134 for generating a slot separator, which is 1 bit of logical value "1".

The MPX encoder 122 also comprises a shift register 135. The shift register 135 receives each data group of N-bit register data thus sequentially latched from the latch circuits 131-1–131-N, the odd parity from the parity generation circuit 133, the start code from the start code generation circuit 132, and the slot separator from the slot separator generation circuit 134. The shift register 135 adds the odd parity to each data group of N-bit register data to form a (N+1)-bit data slot. The shift register 135 then adds the start code before each of the M data slots associated with M data groups. The shift register 135 further adds the slot separator after each start code and each data slot, thereby forming the data sequence for one translate cycle (see FIG. 10). The shift register 135 transmits each of the data sequences as a serial data.

The MPX encoder 122 also comprises a bi-phase encoding circuit 136 for receiving the serial data from the shift register 135 and performing bi-phase encoding on the serial data to obtain output data DATA OUT.

The latch circuits 131-1–131-N, start code generation circuit 132, parity generation circuit 133, slot separator generation circuit 134, shift register 135, and bi-phase encoder 136 are clocked by the clock signal CK supplied thereto.

Referring to FIG. 13, operations of the MPX encoder 122 will be described below. The latch circuits 131-1–131-N receives n sets of 1-bit data D1–Dn as the control signals. The latch circuits 131-1–131-N also divides the data D1–Dn into M data groups of N sets of data, so that N sets of data can be latched in sequence. In this instance, the latch circuits 131-1–131-N latch each data group in one data slot cycle, repeat this latching M times, poses for 1 data slot cycle. Similarly, they repeat such the latching that each data group is latched M times in sequence. Thus, the N-bit register data thus obtained by the sequential latching in the latch circuits 131-1–131-N is supplied to the shift register 135 as a parallel data.

The N-bit register data obtained by the sequential latching in the latch circuits 131-1–131-N in sequence is also supplied to the parity generation circuit 133. The parity generation circuit 133 generates 1-bit odd parity for each set of N-bit register data. The odd parity generated by the parity generation circuit 133 is supplied to the shift register 135.

In the shift register 135, the odd parity generated by the parity generation circuit 133 is added to each data groups of the N-bit register data obtained by the sequential latching in the latch circuits 131-1–131-N to form a (N+1)-bit data slot. Further, the start code generated by the start code generation circuit 132 is added before the M data slots associated with the M data groups. The slot separators generated by the slot separator generation circuit 134 are added after the start code and the respective data slots. Thus, data sequence for one translate cycle is formed (see FIG. 10).

From the shift register 135, each data sequence is sequentially transmitted as a serial data to the bi-phase encoder 136. In the bi-phase encoder 136, the serial data received from the shift register 135 is bi-phase encoded to provide serial output data (DATA OUT). The clock signal CK supplied to the different circuits described above is also output from the MPX encoder 122 as a clock output signal (CK OUT). The clock output signal (CK OUT) is transmitted to the devices associated with the rotary drum via the rotary transformer 106 independently of the output data DATA OUT.

Figure 14:
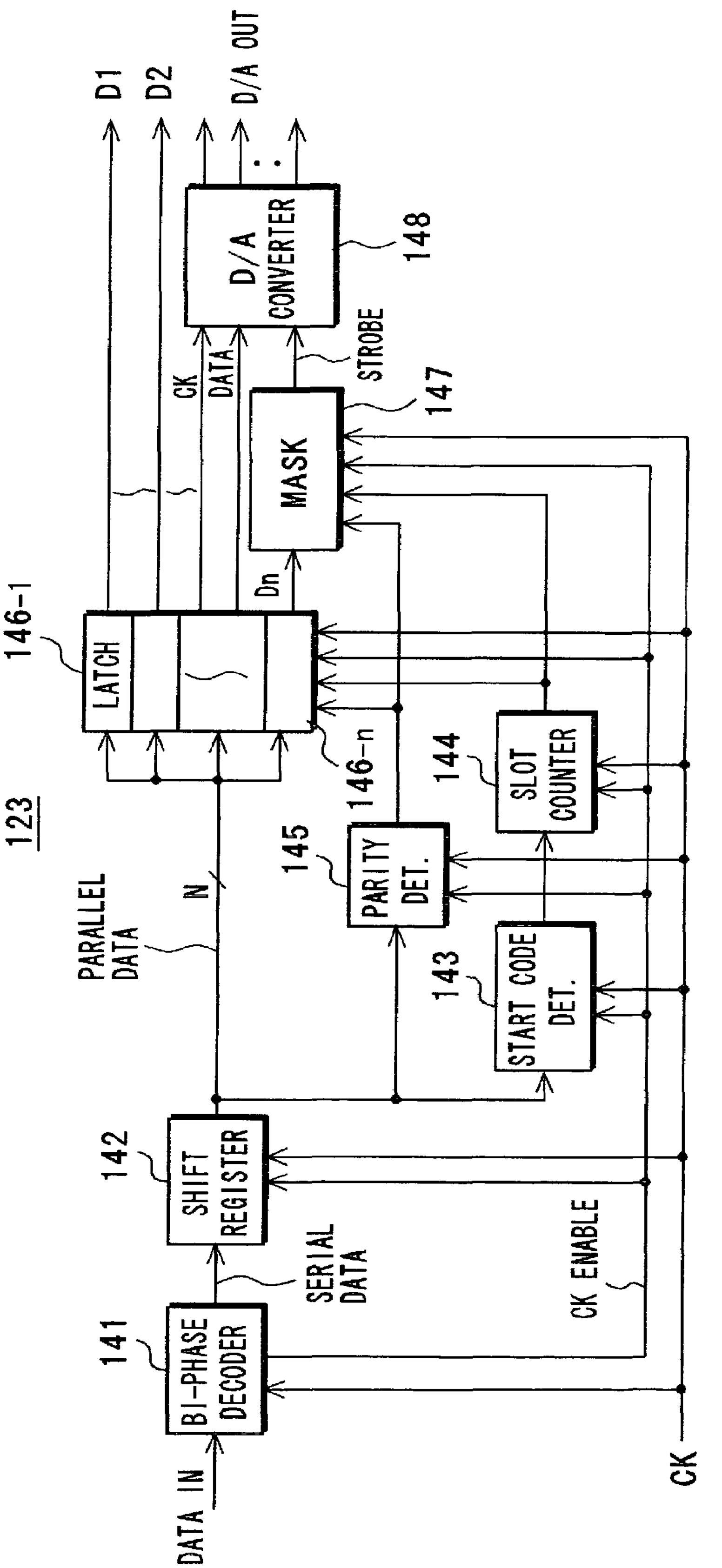
FIG. 14 is a block diagram representation of an MPX decoder as an embodiment of the invention.

FIG. 14 shows a configuration of the MPX decoder 123. The MPX decoder 123 comprises a bi-phase decoder 141 for performing bi-phase decoding on the input serial data DATA IN to sequentially obtain data sequences for one translate cycle. As is well known, the bi-phase decoder 141 generates from the input data DATA IN a clock enable signal CK ENABLE and performing bi-phase decoding on the input data DATA IN using this clock enable signal CK ENABLE.

The clock enable signal CK ENABLE generated by the bi-phase decoder 141 is also supplied to a shift register 142, a star code detection circuit 143, a slot counter 144, a parity detection circuit 145, latch circuits 146-1–146-*n*, and a mask circuit 147, which will be described later. These circuits, including the bi-phase decoder 141, are also coupled with the clock signal CK, so that they are timed by the clock signal CK and enabled by the clock enable signal CK ENABLE. Although details of the clock signal CK is omitted for simplicity, it is the output clock signal CK OUT provided by the above described MPX encoder 122 via the rotary transformer 106.

The MPX decoder 123 also comprises the shift register 142 for shifting each data sequence obtained in the bi-phase decoder 141. The shift register 142 consists of (N+1) registers corresponding to one data slot, which are serially connected.

The MPX decoder 123 further comprises the start code detection circuit 143 for detecting a start code in the respective outputs of (N+1) registers of the shift register 142, and the parity detection circuit 145 for detecting a transmission error in the respective outputs of (N+1) registers of the shift register 142. The MPX decoder 123 further comprises the slot counter 144 for allowing the count values thereof to be reset to logic value "0" by detection signal from the start code detection circuit 143 and then to vary from 1 to M when the (N+1) registers of the shift register 142 hold the first through M data slots consisting of the data sequence for one translate cycle.

The MPX decoder 123 also comprises the latch circuits 146-1–146-*n*. The latch circuits 146-1–46-*n* allow their latch circuits corresponding to the count values to sequentially latch the outputs of N registers corresponding to N sets of register data forming a data slot in the shift register 142 (excluding the dummy data described above) when the count of the slot counter 144 varies from 1 to M, thereby obtaining the sets of data D1–Dn as the control signals. If the count value of the slot counter 144 varies from 1 to M when the parity detection circuit 145 detects an error in the transmitted data, the latch circuits 146-1–46-*n* stop latching the data.

The MPX decoder 123 also comprises a D/A converter 148 having a serial interface. Of the sets of data D1–Dn as the control signals from the latch circuits 146-1–46-*n*, the data representing the clock signal CK, the data representing strobe signal STROBE, and the data representing the input data DATA, as control signal for the D/A converter system, are respectively supplied to the D/A converter 148. The D/A converter 148 transmits a multiplicity of analog signals (D/A OUT) for controlling, for example, gains of record amplifiers of multiple channels.

Figure 6:
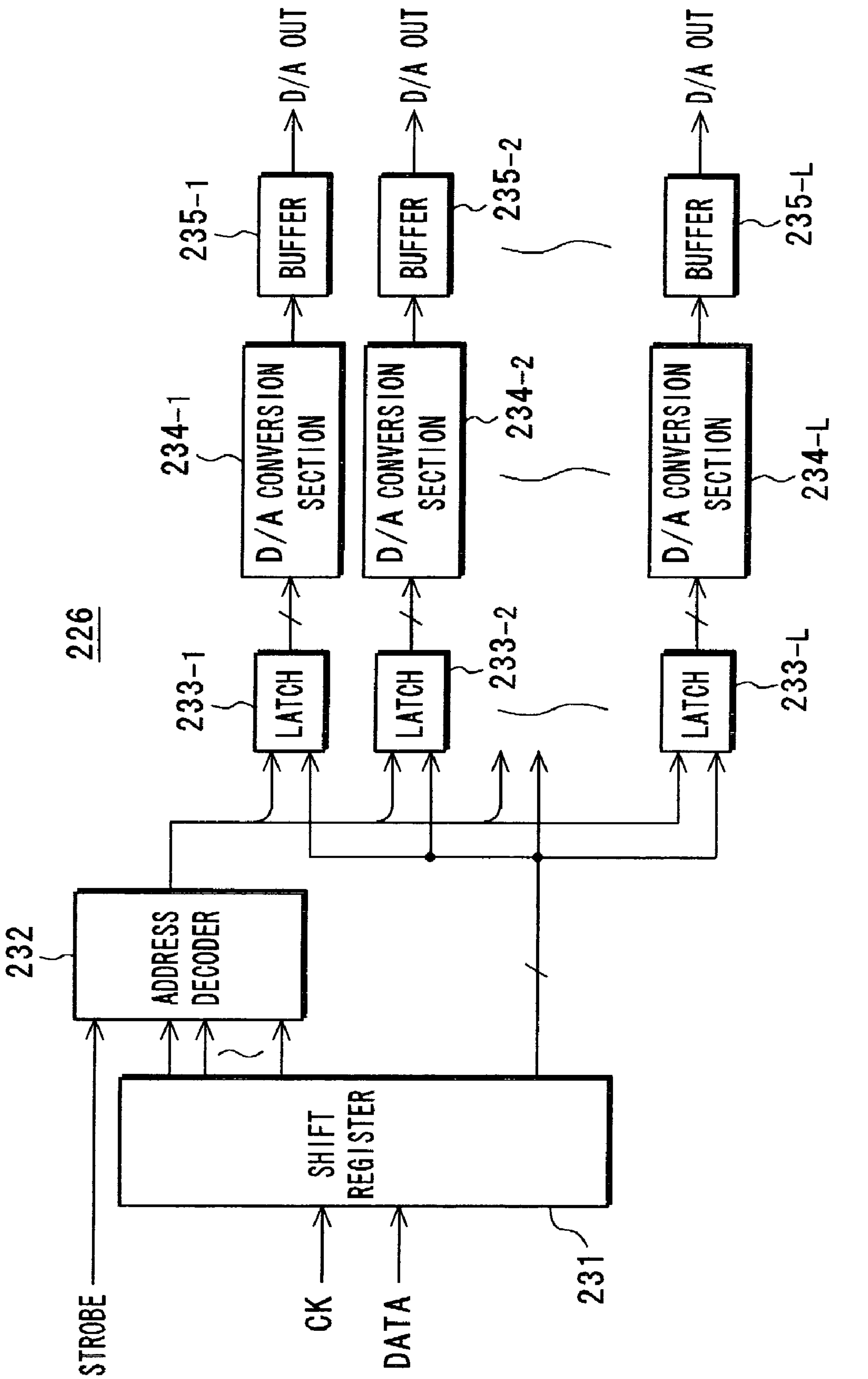
FIG. 6 is a block diagram representation of a D/A converter in the conventional MPX decoder.

The D/A converter 148 has a similar arrangement as the D/A converter 226 (see FIG. 6) of the above conventional MPX decoder 220 and hence its details will not be described here.

The MPX decoder 123 comprises a mask circuit 147. The mask circuit 147 is inserted in a path of the strobe signal STROBE supplied from one of the latch circuits 146-1–46-*n* to the D/A converter 148. When the parity detection circuit 145 detects an error in the N-bit register data associated with the control signals for the D/A converter system (said error referred to a D/A converter system transmission error), the mask circuit 147 masks the strobe signal STROBE for an interval between the error detection and the fall of the strobe signal.

Based on the count value of the slot counter 144, the mask circuit 147 determines whether or not the transmission error detected by the parity detection circuit 145 is the D/A converter system transmission error. The mask circuit 147 sets an error flag when the parity detection circuit 145 detects the D/A converter system transmission error, and clears the flag at the fall of the associated strobe signal STROBE. The mask circuit 147 masks the strobe signal STROBE while the flag is set.

Referring to FIG. 14, operations of the MPX decoder 123 will be described below. Serial input data DATA IN is supplied to the bi-phase decoder 141. The input data DATA IN is the output data DATA OUT provided by the MPX encoder 122 via the rotary transformer 106. The bi-phase decoder 141 performs bi-phase decoding on the input data DATA IN to obtain, in sequence, the data sequences for each translate cycle. Each data sequence obtained in the bi-phase decoder 141 is sequentially supplied to the shift register 142.

The outputs of the (N+1) registers of the shift register 142 are supplied to the start code detection circuit 143 for detection of a start code. The detection signal from the start code detection circuit 143 is supplied to the slot counter 144. The slot counter 144 is reset by the detection signal, and then increments its count value by 1 up to M. In this case, the increment of the count value takes place as the first through the $M^{th}$ data slots consisting of the data sequence for one translate cycle, are sequentially registered in the (N+1) registers of the shift register 142.

The count value of the slot counter 144 is supplied to the latch circuits 146-1–46-*n.*

The outputs of the (N+1) registers of the shift register 142 are supplied to the parity detection circuit 145 for detection of transmission errors in the outputs. The detection signal of the parity detection circuit 145 is supplied to the latch circuits 146-1–46-*n.*

The latch circuits **146-1–46-*n* are provided with the outputs of N registers in the shift register 142 corresponding to N sets of register data that form a data slot. In the latch circuits 146-1–46-*n*, the latch circuits corresponding to the count of the slot counter 144 sequentially latch the outputs of the N registers in the shift register 142 corresponding to N register data that form a data slot (excluding the dummy data described above), to obtain the sets of data D1–Dn as the control signals In the example shown herein, the latch circuits 146-1–46-*n* stop latching the data when the parity detection circuit 145 detects a transmission error even if the count value of the slot counter 144 varies from 1 to M. The latch circuits 146-1–46-*n* keep holding the previously latched data. This prohibits the error-accompanying data from being latched in the latch circuits 146-1–46-*n*, thereby preventing such erroneous data D1**–Dn from being output as the control signals.

Figure 1:
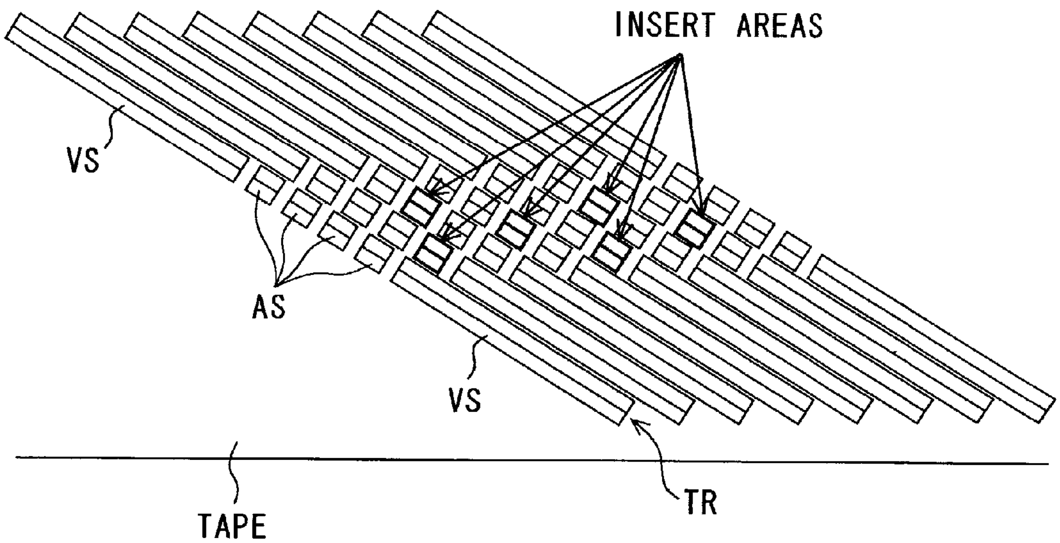
FIG. 1 is a diagram showing a tape format of a digital VTR.
Figure 2:
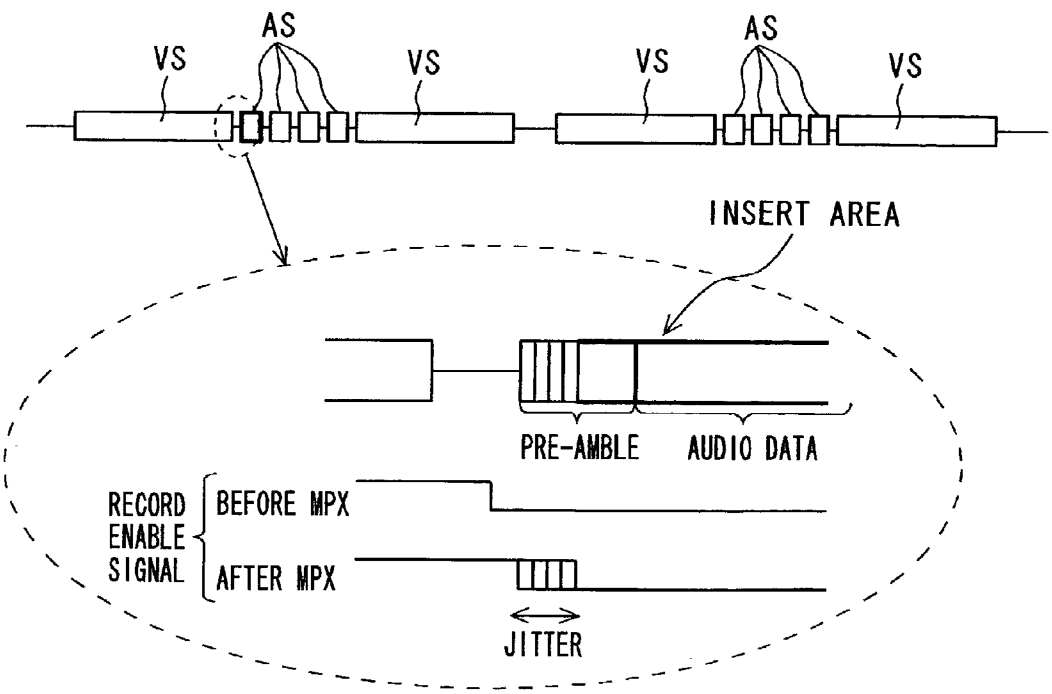
FIG. 2 is an enlarged view of an insert area in the digital VTR.
Figure 3:
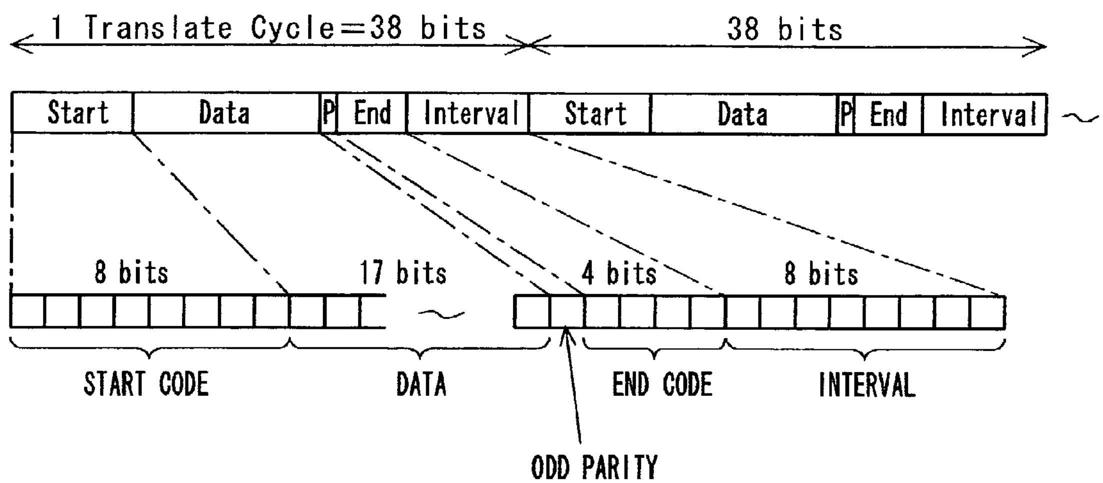
FIG. 3 is a diagram showing a serial data format for use with conventional MPX scheme;.
Figure 4:
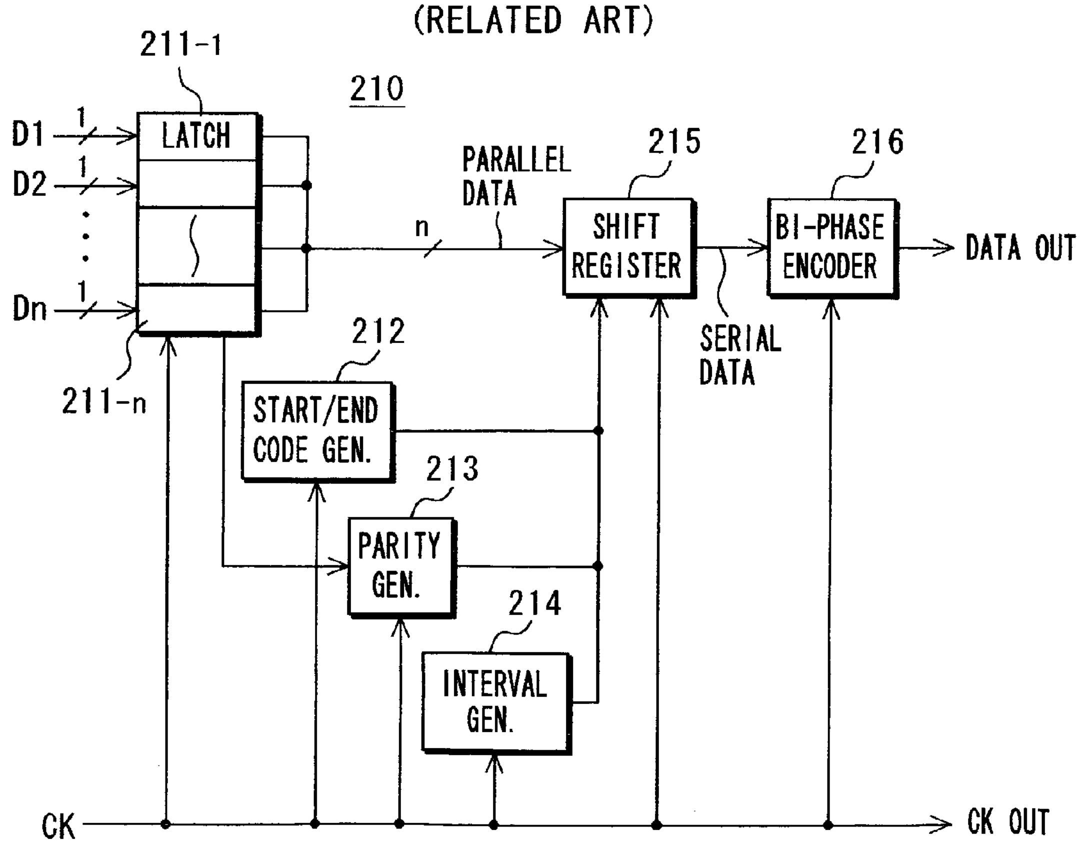
FIG. 4 is a block diagram representation of a conventional MPX encoder.
Figure 5:
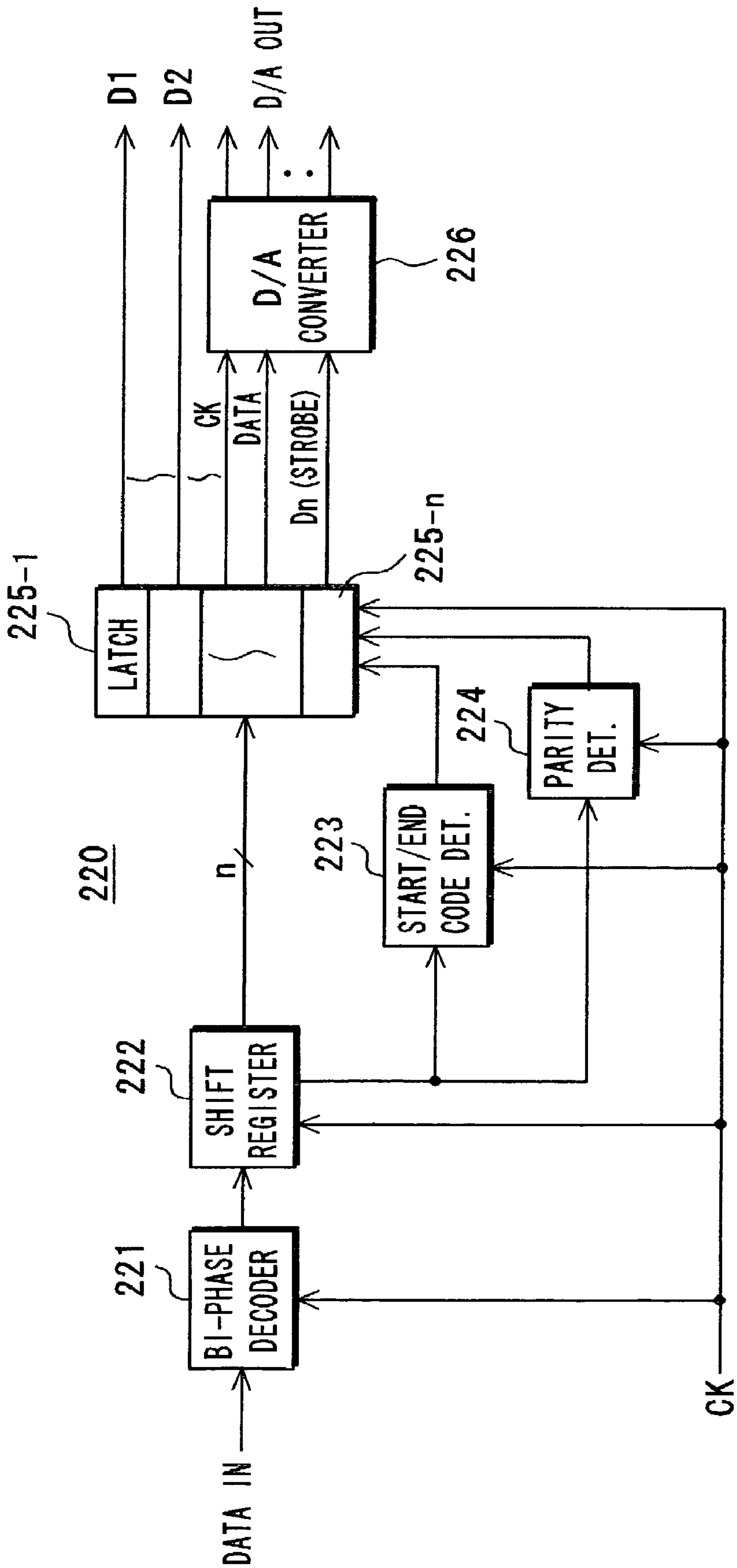
FIG. 5 is a block diagram representation of a conventional MPX decoder.

Here, the parity detection circuit 145 may detect the transmission error every data slot. It should be understood that only the register data associated with the particular data slot involving the transmission error will be not latched in the latch circuits **146-1–46-*n* when detecting the transmission error, and that this non-latching process will not affect the entire control signals to be output from the latch circuits 146-1–46-*n*. Note that in the convention MPX decoder 220 as shown in FIG. 5, the entire n-bit register data will not be latched in the latch circuits 225-1–225-*n* when the parity detection circuit 224 detects the transmission error. Therefore, this has affected the entire multiple control signals to be output from the latch circuits 225-1–225-*n***.

Of the sets of data D1–Dn as the control signals from the latch circuits **146-1–46-*n*, the data representing the clock signal CK, the data representing the strobe signal STROBE, and the data representing the input data DATA are supplied to the D/A converter 148, respectively. In the D/A converter 148, the input data DATA is sequentially registered in the shift register in synchronism with the clock signal CK (see the description about FIG. 6**).

Figure 7:
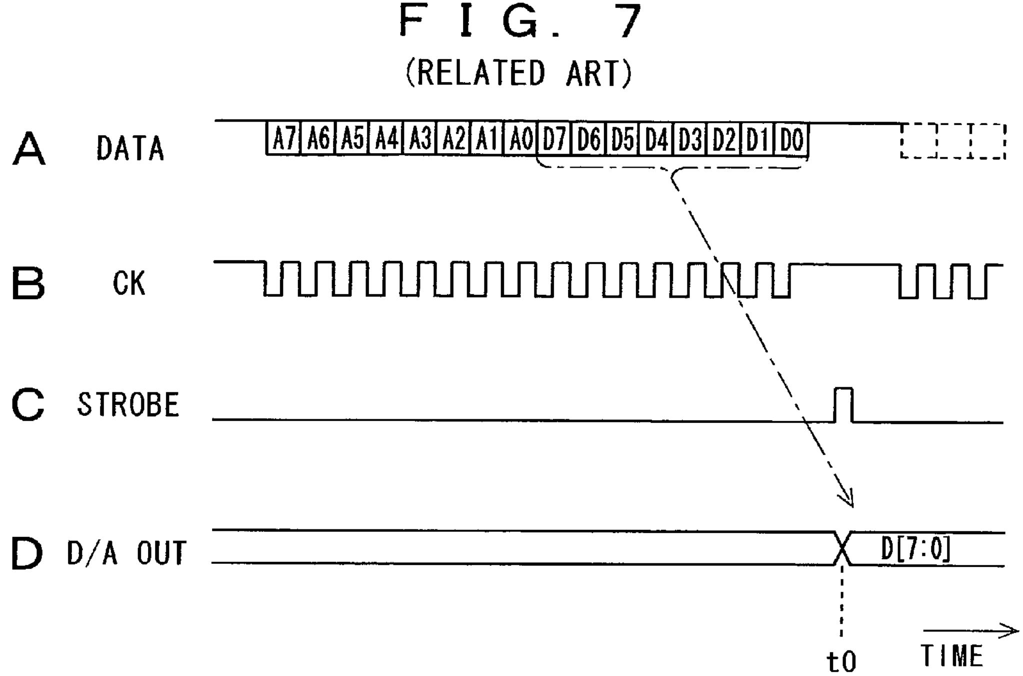
FIG. 7 is a timing diagram illustrating operations of the D/A converter.
Figure 8:
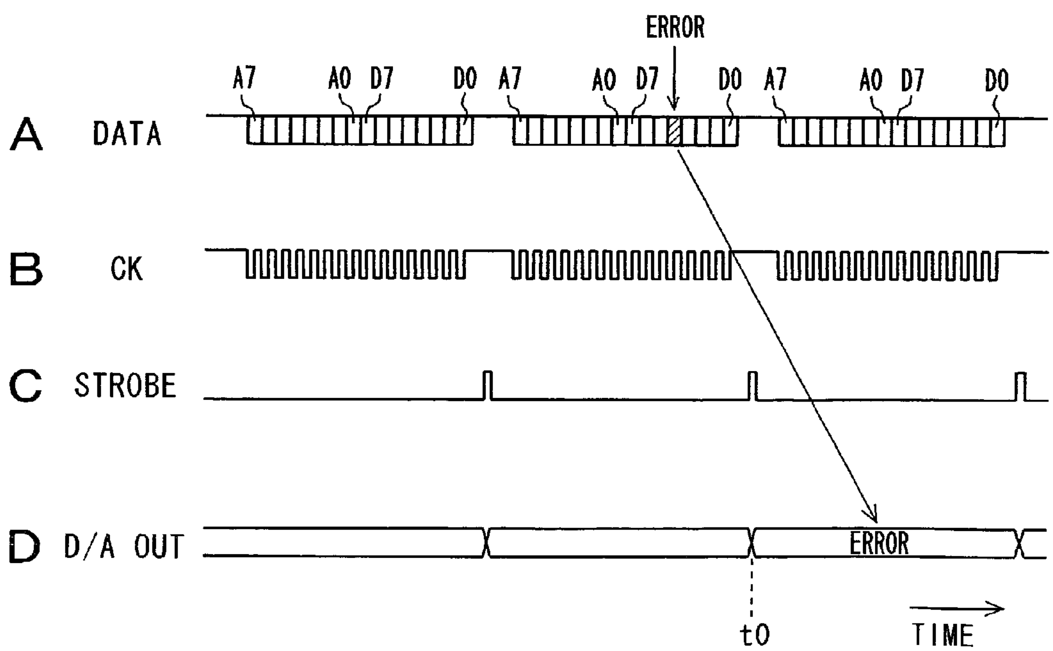
FIG. 8 is a timing diagram illustrating an error occurring timing in the D/A converter.

The input data DATA comprises a separate data sequence consisting of address data A7–A0 indicating which of the channels the input data is associated with, and of subsequent gain control data D7–D0 for controlling the gain of the record amplifier of the channel specified by the address data. The value of the analog output signal D/A OUT controlling the gain of the record amplifier in the channel specified by the address data in the separate data sequence is updated, at the STROBE supply timing, to the value that corresponds to the gain control data in the separate data sequence (see FIGS. 7-(A) through 7-(D)).

Of the sets of data D1–Dn as the control signals from the latch circuits **146-1–46-*n*, the data representing the strobe signal STROBE is supplied to the D/A converter 148 via the mask circuit 147. The detection signal issued from the parity detection circuit 145 is supplied to the mask circuit 147. The mask circuit 147 sets the error flag when the parity detection circuit 145 detects the D/A converter system transmission error while the mask circuit 147 clears the error flag at the fall of the associated strobe signal STROBE. The mask circuit 147 masks the strobe signal STROBE while the flag is set so as to prohibit from supplying the strobe signal STROBE to the D/A converter 148**.

When the parity detection circuit 145 detects the D/A converter system transmission error, the latch circuits **146-1–46-*n* stop latching the N-bit register data associated with the control data for the D/A converter system. This causes the input data DATA fed to the D/A converter 226 to be erroneous. If an error is involved in the address data A7–A0 or the gain control data D7–D0 forming the separate data sequence of the input data DATA fed to the D/A converter 226, an error occurs in the D/A converter 148. That is, the error can update the analog output signal D/A OUT of a wrong channel, or generate a wrong output level for the right channel as the analog output signal D/A OUT of a particular channel. As described above, by masking the strobe signal STROBE by the mask circuit 147, such errors of the D/A converter 148** can be prevented.

Figure 15:
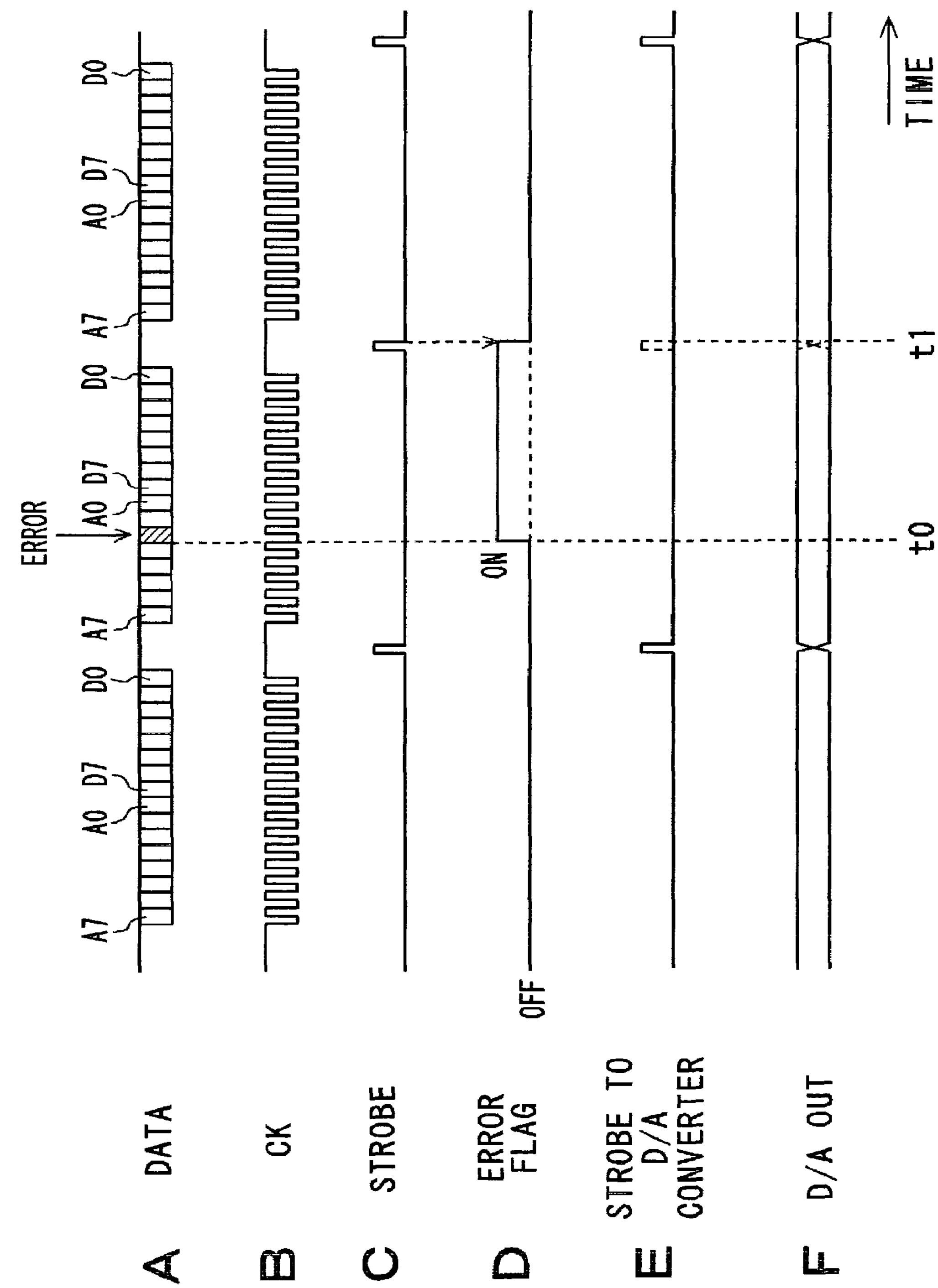
FIG. 15 is a timing diagram illustrating the method of preventing errors from occurring in the D/A converter of the MPX decoder.

FIG. 15 illustrates the operations of the parity detection circuit 145 when it detects a transmission error in any one of the address data A7–A0 of the separate data sequence of the input data DATA.

Suppose now that the parity detection circuit 145 detects the D/A converter system transmission error at time t0 in correspondence with any one of the transmitted address data A7–A0 of the separate data sequence of the input data DATA, as shown in FIG. 15-(A). Since the D/A converter 148 is coupled with the input data DATA and the clock signal CK as shown in FIG. 15-(B), the shift register 231 receives the separate data sequence possibly involving an error in the address data A7–A0, in synchronism with the clock signal CK (see FIG. 6) However, as shown in FIG. 15-(D), an error flag is set in the mask circuit 147 at time to, which remains set until it is cleared by the next fall of the strobe signal STROBE (at time t1) provided by the latch circuits **146-1–46-*n*, as shown in FIG. 15-(C). Accordingly, one strobe signal STROBE subsequent to the D/A converter system transmission error detection by the parity detection circuit 145 will not be supplied to the D/A converter 148, as shown in FIG. 15-(E). As a result, the D/A converter 148 is prohibited from updating the analog output signal D/A OUT of the channel specified by the possibly erroneous address data A7–A0, as shown in FIG. 15**-(F).

The broken lines in the FIGS. 15-(D) through 15-(F) indicate the normal operations that would take place if no D/A converter system transmission error had been detected by the parity detection circuit 145.

As described above, according to the embodiment, in the MPX encoder 122 shown herein, one data slot consists of N sets of register data each being assigned to the separate control signals and the odd parity. The MPX encoder 122 transmits the multiple control signals in the form of such data sequence for one translate cycle that includes M data slots and an (N+1)-bit start code placed ahead of the M data slots. This permits efficient transmission of the multiple control signals without a need to increase redundancy of, for example, start code, if the control signals are increased in number. Consequently, the translate cycle of register data in the MPX decoder 123 side can be shortened, and hence the jitters of the control signals such as a record enable signal in the devices associated with the rotary drum can be shortened, thereby facilitating achieving accurate audio insert.

The start code is formed of consecutive (N+1) bits of logical value "0". One data slot consist of N sets of register data and the odd parity. Thus, the data slot will never be consecutive (N+1) bits of logical value "0". This allows the start code detection circuit 143 of the MPX decoder 123 to ensure the detection of the start code. Since 1-bit of logical value "1" is placed as a slot separator after the start code and after every data slot, all together constituting the data sequence for one translate cycle, the start code and the respective data slots can be clearly distinguished in the MPX decoder 123 side.

In the embodiment, same register data associated with a certain control signal is distributed over a multiplicity of slots so that the translate cycle for that control signal for the MPX decoder 123 side can be made shorter than one translate cycle. This allows a faster translate cycle for certain signals such as record enable signal in insert-recording of audio signals in digital VTR and flying erase signal, that require a high precision data processing.

According to the embodiment, the latch circuits **146-1–46-*n* of the MPX decoder 123 stop latching the data when the parity detection circuit 145 detects a transmission error, even if the count value of the slot counter 144 varies from 1 to M. In that event, the MPX decoder 123 holds on the preceding latch outputs. Thus, the latch circuits 146-1–46-*n*** are prohibited from latching the erroneous register data involving the transmission error, thereby preventing the erroneous data D1–Dn from being output as the control signals.

According to the embodiment, in the MPX decoder 123, among the sets of data D1–Dn as the control signals from the latch circuits **146-1–46-*n*, the data representing the strobe signal STRPBE is supplied to the D/A converter 148 via the mask circuit 147, and the parity detection circuit 145 detects the D/A converter system transmission error, if any. When an error exist in any one of the address data A7–A0 and gain control data D7–D0 forming the separate data sequence of the input data DATA, the strobe signal STROBE is not supplied to the D/A converter 148. Accordingly, the invention prevents errors from occurring in the D/A converter 148** by prohibiting from updating the analog output signals D/A OUT of a wrong channel other than the particular channel to be updated, obtaining signal having a wrong level as the analog output signals D/A OUT of the particular channel and the like.

According to the embodiment, in the MPX decoder 123 shown in FIG. 14, the mask circuit 147 masks the strobe signal STROBE to be sent to the D/A converter 148 when the parity detection circuit 145 detects a transmission error, to prevent erroneous operations to occur in the D/A converter 148. Alternatively, a transmission error, namely, an error in the input data DATA sent to the D/A converter 148 is detected on the basis of the bi-phase encoding rules so that a strobe signal to be sent to the D/A converter 148 may be masked upon detection thereof.

The bi-phase decoder 141 may detect such the transmission error based on the bi-phase encoding rules. To do this, operations of the bi-phase encoder 136 of the MPX encoder 122 and bi-phase decoder 141 of the MPX decoder 123 will be described with reference to FIG. 16.

Figure 16:
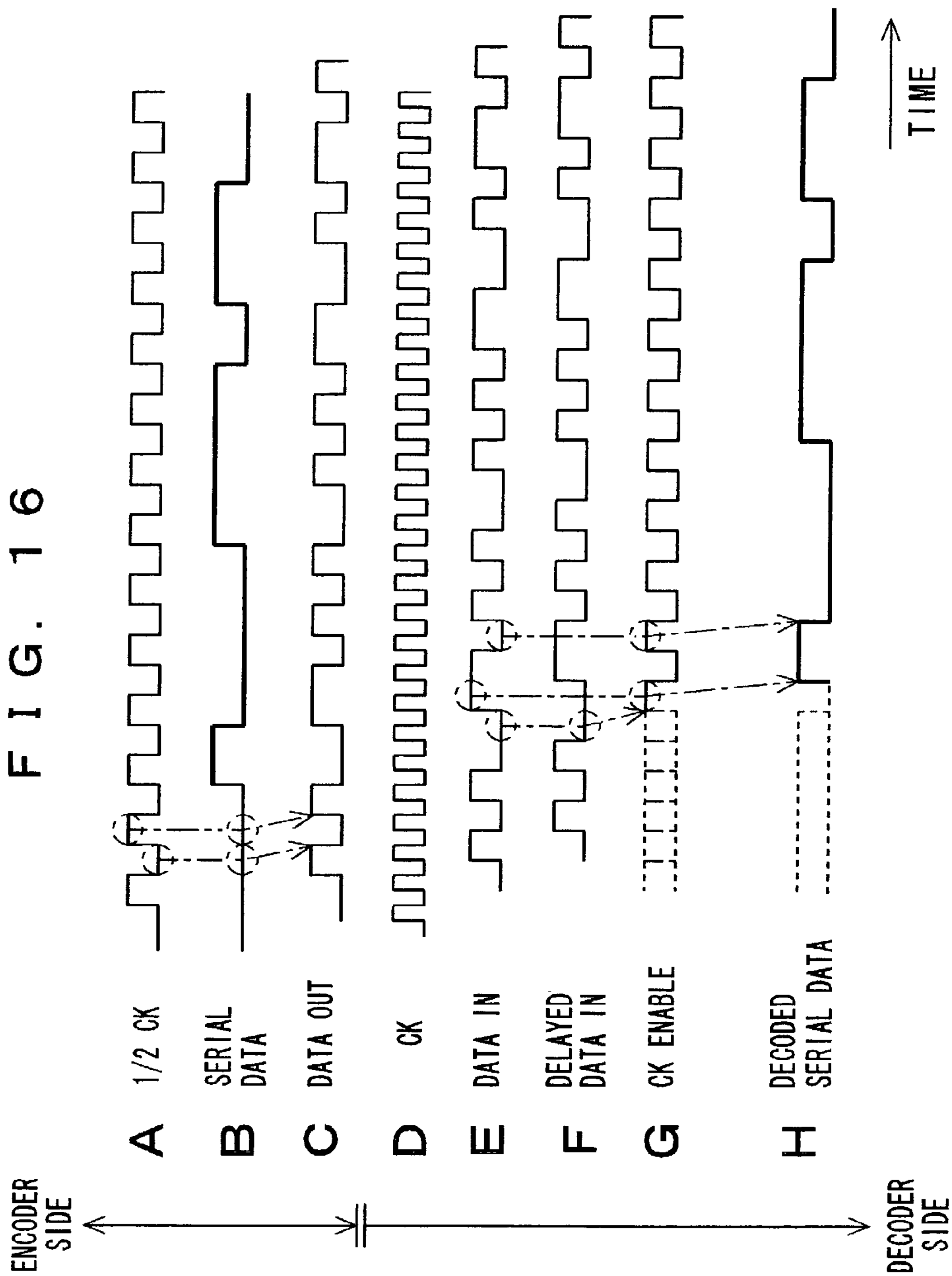
FIG. 16 is a timing diagram illustrating the operations of a bi-phase encoding circuit and a bi-phase decoding circuit.

The bi-phase encoder 136 executes frequency division of the clock signal CK to obtain half-frequency clock ½CK (see FIG. 16-(A)), and executes the EXCLUSIVE OR of the clock ½CK and the serial data SERIAL DATA (see FIG. 16-(B)) to generate a bi-phase encoded signal DATA OUT (see FIG. 16-(C)).

The bi-phase encoder 136 receives the bi-phase encoded signal DATA IN (see FIG. 16(E)) in synchronism with the clock signal CK (see FIG. 16-(D)). The bi-phase decoder 141 generates a delayed signal DELAYED DATA IN (see FIG. 16-(F)) by delaying the bi-phase encoded signal DATA IN (see FIG. 16-(E)) by one clock, and then generates from these two signals the clock enable signal CK ENABLE (see FIG. 16-(G)). In this instance, the clock enable signal CK ENABLE (see FIG. 16-(G)) is set to logical value "1" if, during a given clock period, the clock enable signal CK ENABLE has logical value "0" in the immediately preceding clock period or if the bi-phase encoded signal DATA IN and the signal DELAYED DATA IN have the same logical values, but it is set to logical value "0" otherwise.

The bi-phase decoder 141 holds on the value of the bi-phase encoded signal DATA IN if, during a given clock, the clock enable signal CK ENABLE in the immediately preceding clock period has logical value "1", but otherwise (i.e. the clock enable signal CK ENABLE in the immediately preceding clock period has logical value "0"), it holds on the logic value it had in the preceding clock period, thereby generating the decoded serial data DECODED SERIAL DATA (see FIG. 16-(H)).

Next, referring to FIG. 17, a method of detecting a transmission error, if any, in the bi-phase encoded signal DATA IN, will be described.

Figure 17:
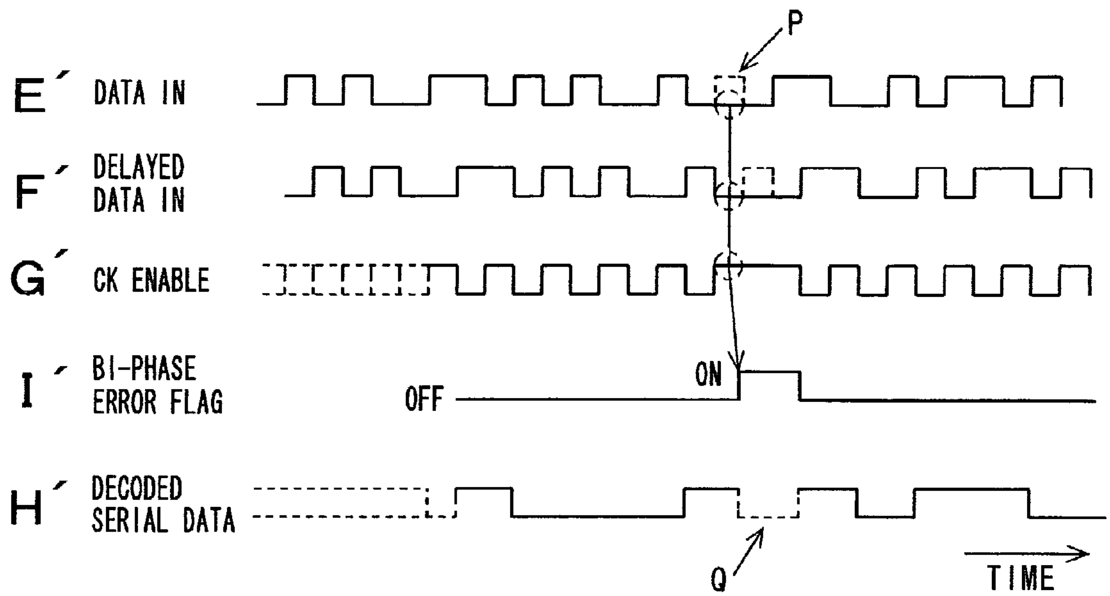
FIG. 17 is a timing diagram illustrating detection of a transmission error according to the bi-phase encoding rules.

Suppose now that the transmission error takes place at point P in the bi-phase encoded signal DATA IN, as shown in FIG. 17-(E'). In this instance, the clock enable signal CK ENABLE, formed from the bi-phase encoded signal DATA IN and the delayed signal DELAYED DATA IN (see FIG. 17-(F')), is affected by the transmission error that occurred in the bi-phase encoded signal DATA IN at the point in time indicated by arrow P (see FIG. 17-(G')). As a result, the decoded serial data DECODED SERIAL DATA (FIG. 17-(H')) generated using the clock enable signal CK ENABLE has an error at the point indicated by arrow Q.

At this stage, the bi-phase decoder 141 generates a bi-phase error flag BI-PHASE ERROR FLAG (FIG. 17-(I')), as follows. The bi-phase error flag is set (logical value "1") if, during a given clock period, the clock enable signal CK ENABLE in the immediately preceding clock period has logical value "1" and at the same time the bi-phase encoded signal DATA IN and the delayed signal DELAYED DATA IN have the same logical values. Otherwise, the flag is cleared (logical value "0"). The bi-phase flag is set for the period in which the decoded serial data has an error. It appears that the decoded serial data is erroneous over the period in which the bi-phase error flag is set.

Therefore, in accordance with the invention, the bi-phase error flag generated by the bi-phase decoder 141 is supplied to the mask circuit 147, for example so that the mask circuit 147 stops supplying the next strobe signal STROBE to the D/A converter 148 when the error flag is set, as in the case where an error flag is set when the parity detection circuit 145 detects the D/A converter system transmission error.

In this manner, when an error is involved in the input data DATA given to the D/A converter 148 due to a transmission error born in the bi-phase encoded signal DATA IN, the mask circuit 147 masks the strobe signal STROBE, thereby prohibiting the D/A converter 148 from outputting its analog output signal that contains an error.

In the example shown herein, if two bits, for example, are incorrect in the same data slot, so that the parity detection circuit 145 cannot detect the errors, the bi-phase error flag generated by the bi-phase decoder 141 is set for the decoded serial data DECODED SERIAL DATA during the error marked period, thereby permitting detection of the errors and securely prohibiting the issuance of error analog output from the D/A converter 148.

Using the bi-phase error flag, one can spot incorrect bit data in the decoded serial data. Thus, instead of entirely masking the strobe signal STROBE when the bi-phase error flag is set, the strobe signal STROBE may be masked only when it is certain that an incorrect bit data exists in the input DATA. Alternatively, by spotting the incorrect bit data in the decoded serial data DECODED SERIAL DATA, the error may be corrected and the decoded serial data thus corrected may be supplied to the shift register 142.

It has been described in the above embodiments that the start code is formed of consecutive (N+1) bits of logical value "0" and that 1 data slot is composed of N sets of register data plus the odd parity. It will be apparent to those skilled in the art that N can be an even number, the start code be consecutive (N+1) bits of logical value "1", and 1 data slot consists of N sets of register data plus the even parity. Alternatively, N can be an odd number, the start code be consecutive (N+1) bits of logical value "1", and one data slot consists of N sets of register data plus the odd parity.

It will be understood that in these cases, one data slot will never have consecutive (N+1) bits of logical value "1" and that the start code can be surely detected by the start code detection circuit 143 of the MPX decoder 123. In this case, the value of the slot separator SLOT SEPARATOR added after start code and respective data slots is set to logical value "0".

In the embodiments described above, the MPX decoder 123 shown in FIG. 14 is provided with the mask circuit 147 so that erroneous analog output signal (D/A OUT) is prevented from being output from the D/A converter 148.

Similarly, the conventional MPX decoder 220 as shown in FIG. 5 may be provided with a similar mask circuit to achieve the same effect.

FIG. 18 illustrates an example of such MPX decoder 220A, in which like elements are referred to by like reference numerals as in FIG. 5.

In this MPX decoder 220A, a mask circuit 147A is provided in a path that supplies the strobe signal STROBE from any one of the latch circuits 225-1–225-*n* to the D/A converter 226. When the parity detection circuit 224 detects a transmission error, the error flag is set from that time until the strobe signal STROBE falls next. The mask circuit 147 masks the strobe signal STROBE for this error flag set period. Alternatively, the MPX decoder 220A may be configured to detect a transmission error based on the bi-phase encoding rules and mask the strobe signal STROBE to the D/A converter 226 by the mask circuit 147A when it is likely that an error is involved in the input data DATA supplied to the D/A converter 226.

Although the invention has been described with particular reference to the above embodiments where a multiplicity of control signals are serially transmitted to the rotation dram side of the digital VTR 100, the present invention can be effected equally well in other types of apparatus and systems that utilize a D/A converter having a serial interface.

Further, although the above embodiments in which the invention is applied to the digital VTR capable of recording and reproducing the data have been described, the invention may be equally applied to different types of tape drives including an audio tape recorder and a dedicated reproduction tape drive.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A digital-to-analog conversion apparatus, comprising:

a digital-to-analog conversion section having a serial interface;

error detection means for detecting an error in input data supplied to said digital-to-analog conversion section; and mask means for masking a strobe signal to be supplied to said digital-to-analog conversion section to prevent said digital-to-analog conversion section from outputting an analog output signal corresponding to said input data when said error detection means detects said error in said input data.

2. The digital-to-analog conversion apparatus according to the claim 1, wherein said input data includes a set of bit data extracted in sequence from a prescribed unitary data sequence constituting serial transmission signal that is obtained by converting transmission signal to a serial signal; and wherein said error detection means detects an error in said input data by detecting the error using parity contained in said prescribed unitary data sequence of said transmission signal.

3. The digital-to-analog conversion apparatus according to the claim 2, wherein said transmission signal is formed of a sequence of data sequences of one translate cycle, each data sequence including M data slot, where M is a positive integer plus an N+1-bit start code placed ahead of said M data slot, where N is a positive integer one data slot containing N set of the register data assigned to each control signal and even/odd parity; and wherein said error detection means detects an error in said input data by detecting the error in said N set of the register data contained in each data slot in each data sequence constituting said transmission signal using said even/odd parity that constitutes, together with said N set of the register data, one data slot.

4. The digital-to-analog conversion apparatus according to the claim 1, wherein said input data is obtained by decoding a bi-phase encoded signal; and wherein said error detection means detects an error in said input data based on bi-phase encoding rule.

5. The digital-to-analog conversion apparatus according to the claim 1, wherein said input data includes bit data sequentially extracted from the prescribed unitary data sequence constituting the transmission signal obtained by decoding a bi-phase encoded signal; and wherein said error detection means detects an error in said input data by detecting the error based on bi-phase encoding rule and detecting the error using parity contained in said prescribed unitary data sequence of said transmission data.

6. A decoder for decoding a transmission signal formed by converting multiple control signals to serial signal, to obtain said multiple control signals, said decoder comprising:

register data extraction means for sequentially extracting multiple sets of register data contained in a prescribed unitary data sequence constituting said transmission signal to output said multiple control signals;

a digital-to-analog conversion section having a serial interface, said digital-to-analog conversion section receiving at least one of said control signals from said register data extraction means as input data;

error detection means for detecting an error in said input data supplied to said digital-to-analog conversion section; and mask means for masking a strobe signal to be supplied to said digital-to-analog conversion section to prevent said digital-to-analog conversion section from outputting an analog output signal corresponding to said input data when said error detection means detects the error in said input data.

7. The decoder for decoding a transmission signal according to the claim 6, wherein said error detection means detects an error in said input data by detecting the error using parity contained in said prescribed unitary data sequence of said transmission signal.

8. The decoder for decoding a transmission signal according to claim 7, wherein said transmission signal is formed of a sequence of the data sequences of one translate cycle, each data sequence including M data slot, where M is a positive integer plus an N+1-bit start code placed ahead of said M data slot, where N is a positive integer, one data slot containing said N set of the register data assigned to each control signal and even/odd parity; and wherein said error detection means detects an error in said input data by detecting the error in said N set of the register data contained in each data slot in each data sequence constituting said transmission signal using said even/odd parity that constitutes, together with said N set of the register data, one data slot.

9. The decoder for decoding a transmission signal according to claim 6, wherein said transmission signal is obtained by decoding a bi-phase encoded signal; and wherein said error detection means detects an error in said input data based on bi-phase encoding rule.

10. The decoder for decoding a transmission signal according to claim 6, wherein said transmission signal is obtained by decoding a bi-phase encoded signal; and wherein said error detection means detects an error in said input data by detecting the error based on bi-phase encoding rule and by detecting the error in said input data using parity contained in said prescribed unitary data sequence of said transmission signal.

11. A tape drive equipped with a decoder, said decoder transmitting a transmission signal formed by converting multiple control signals to serial signal to a rotary drum side of the tape drive via a rotary transformer, and said decoder obtaining said multiple control signals from said transmission signal transmitted to said rotary drum side of the tape drive, wherein said decoder comprises:

register data extraction means for sequentially extracting multiple sets of register data contained in a prescribed unitary data sequence constituting said transmission signal to output said multiple control signals;

a digital-to-analog conversion section having a serial interface, said digital-to-analog conversion section receiving at least one of said control signals from said register data extraction means as input data;

error detection means for detecting an error in said input data supplied to said digital-to-analog conversion section; and mask means for masking a strobe signal to be supplied to said digital-to-analog conversion section to prevent said digital-to-analog conversion section from outputting an analog output signal corresponding to said input data when said error detection means detects the error in said input data.

12. The tape drive according to the claim 11, wherein the output analog signal provided by said digital-to-analog conversion section is a gain control signal for controlling the gain of a record amplifier.

* * * * *